United States Patent
Choi et al.

(10) Patent No.: US 11,925,065 B2
(45) Date of Patent: Mar. 5, 2024

(54) DISPLAY PANELS AND DISPLAY DEVICES

(71) Applicant: Samsung Electronics Co., Ltd., Suwon-si (KR)

(72) Inventors: Ajeong Choi, Suwon-si (KR); Yong Uk Lee, Suwon-si (KR); Chul Baik, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/680,513

(22) Filed: Feb. 25, 2022

(65) Prior Publication Data

US 2022/0231106 A1 Jul. 21, 2022

Related U.S. Application Data

(62) Division of application No. 16/886,089, filed on May 28, 2020, now Pat. No. 11,296,170.

(30) Foreign Application Priority Data

Nov. 27, 2019 (KR) .................. 10-2019-0154514

(51) Int. Cl.
- *H10K 59/12* (2023.01)
- *H01L 27/15* (2006.01)
- *H10K 59/121* (2023.01)
- *H10K 59/122* (2023.01)

(52) U.S. Cl.
CPC ....... *H10K 59/1213* (2023.02); *H01L 27/156* (2013.01); *H10K 59/122* (2023.02)

(58) Field of Classification Search
CPC . H10K 59/1213; H10K 59/122; H01L 27/156
USPC ....................................................... 257/40
See application file for complete search history.

(56) References Cited

U.S. PATENT DOCUMENTS

| 9,214,644 | B2 | 12/2015 | Rinzler et al. |
| 9,379,166 | B2 | 6/2016 | Li et al. |
| 2006/0145144 | A1* | 7/2006 | Lee ............... H10K 10/491 257/40 |

(Continued)

FOREIGN PATENT DOCUMENTS

| KR | 2010-0082498 A | 7/2010 |
| KR | 2016-0043327 A | 4/2016 |

OTHER PUBLICATIONS

Extended European Search Report dated Mar. 24, 2021 for corresponding European Application No. 20209792.9.

*Primary Examiner* — Dzung Tran

(74) *Attorney, Agent, or Firm* — HARNESS, DICKEY & PIERCE, P.L.C.

(57) ABSTRACT

A display panel includes a switching transistor and a light-emitting transistor. The switching transistor includes a first gate electrode, a first source electrode, a first active layer, and a first drain electrode. The light-emitting transistor includes a second gate electrode, a second source electrode, a second active layer, a light-emitting layer, and a second drain electrode. The second gate electrode is the first drain electrode of the switching transistor. The switching transistor and the light-emitting transistor may be on a substrate. The switching transistor, the second source electrode, the second active layer, the light-emitting layer, and the second drain electrode are stacked in a direction perpendicular to the surface of the substrate.

8 Claims, 23 Drawing Sheets

(56) References Cited

U.S. PATENT DOCUMENTS

| | | |
|---|---|---|
| 2008/0272381 A1 | 11/2008 | Noguchi et al. |
| 2009/0230384 A1 | 9/2009 | Meng et al. |
| 2010/0237336 A1 | 9/2010 | Rinzler et al. |
| 2011/0121271 A1 | 5/2011 | Jeon et al. |
| 2012/0097949 A1* | 4/2012 | Tessler ................. H10K 10/491 |
| | | 257/E29.273 |
| 2012/0143568 A1 | 6/2012 | Kagan et al. |
| 2013/0240842 A1 | 9/2013 | Rinzler et al. |
| 2015/0269887 A1* | 9/2015 | Liu ...................... G09G 3/3208 |
| | | 345/212 |
| 2017/0250238 A1* | 8/2017 | Muccini ............. H10K 59/1213 |

* cited by examiner

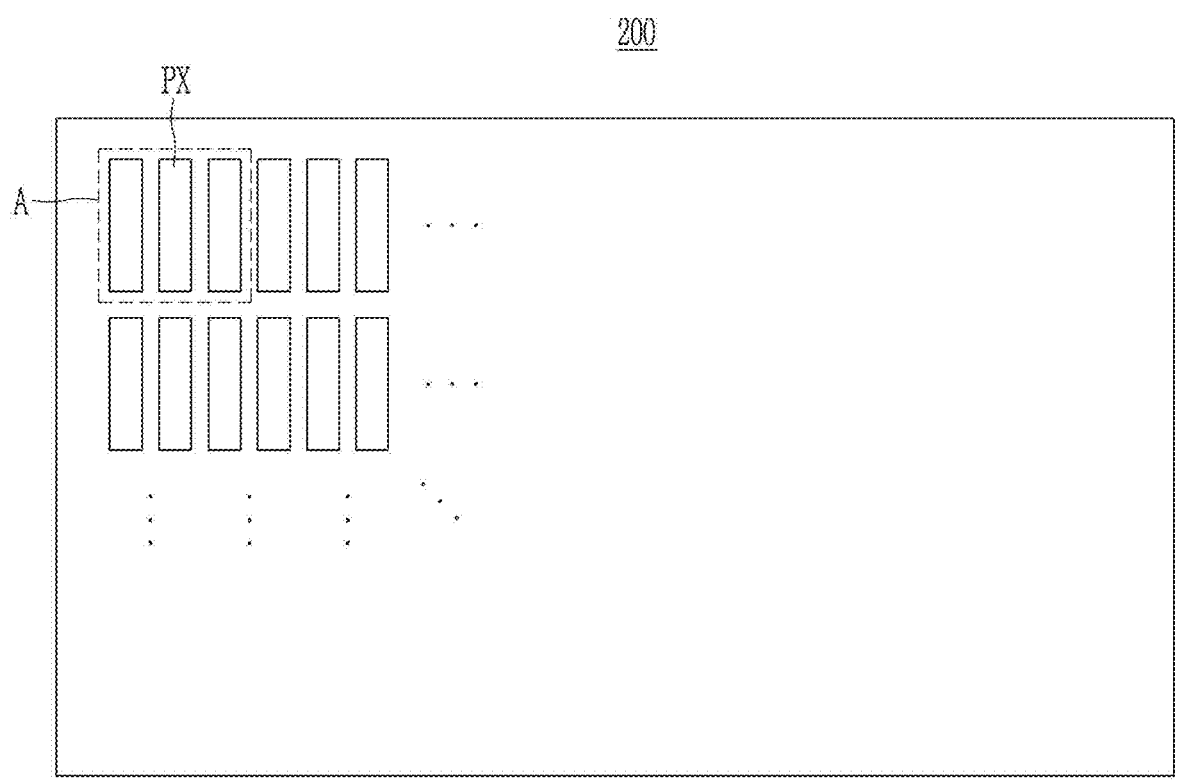
[FIG. 1]

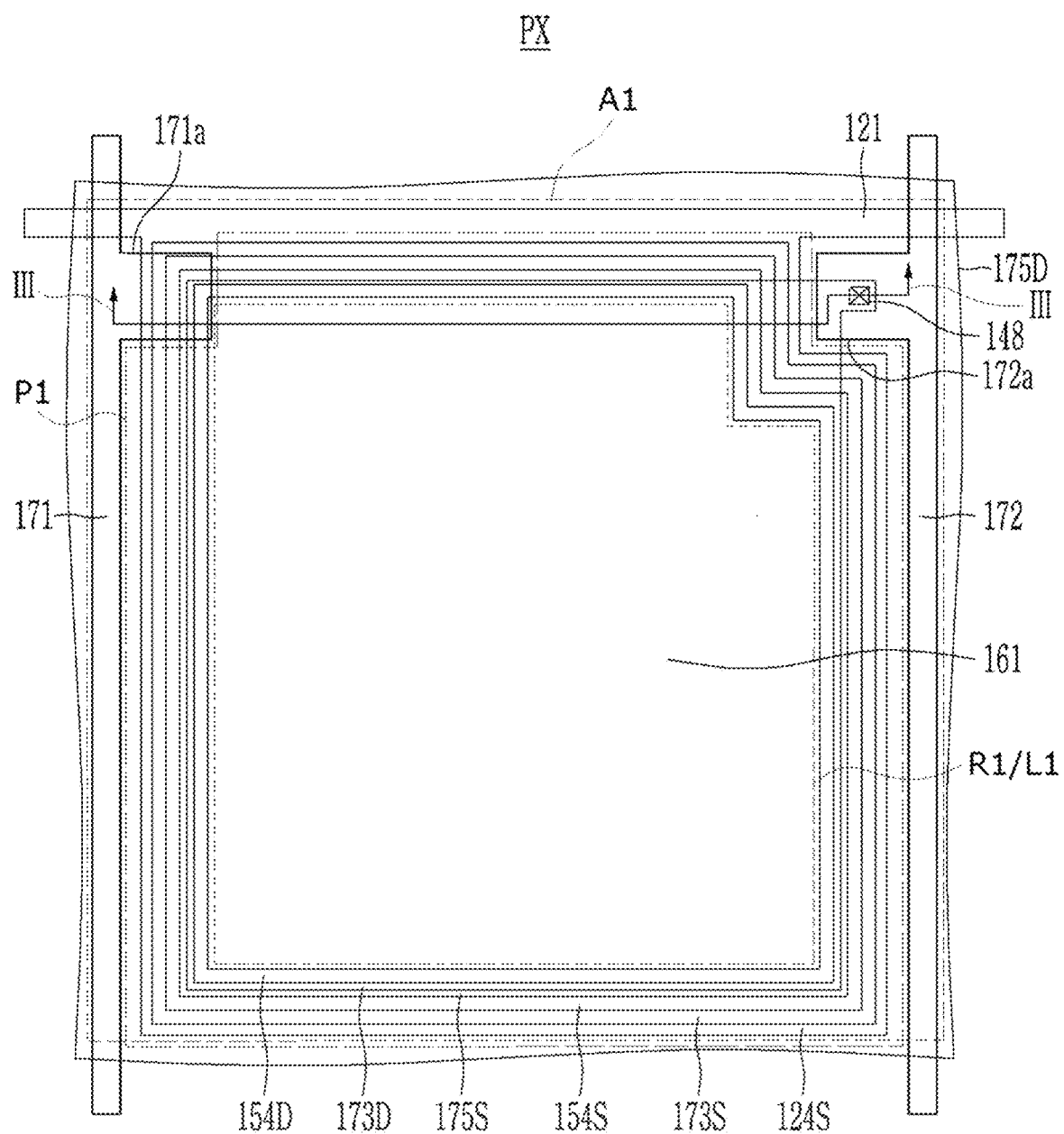
[FIG. 2]

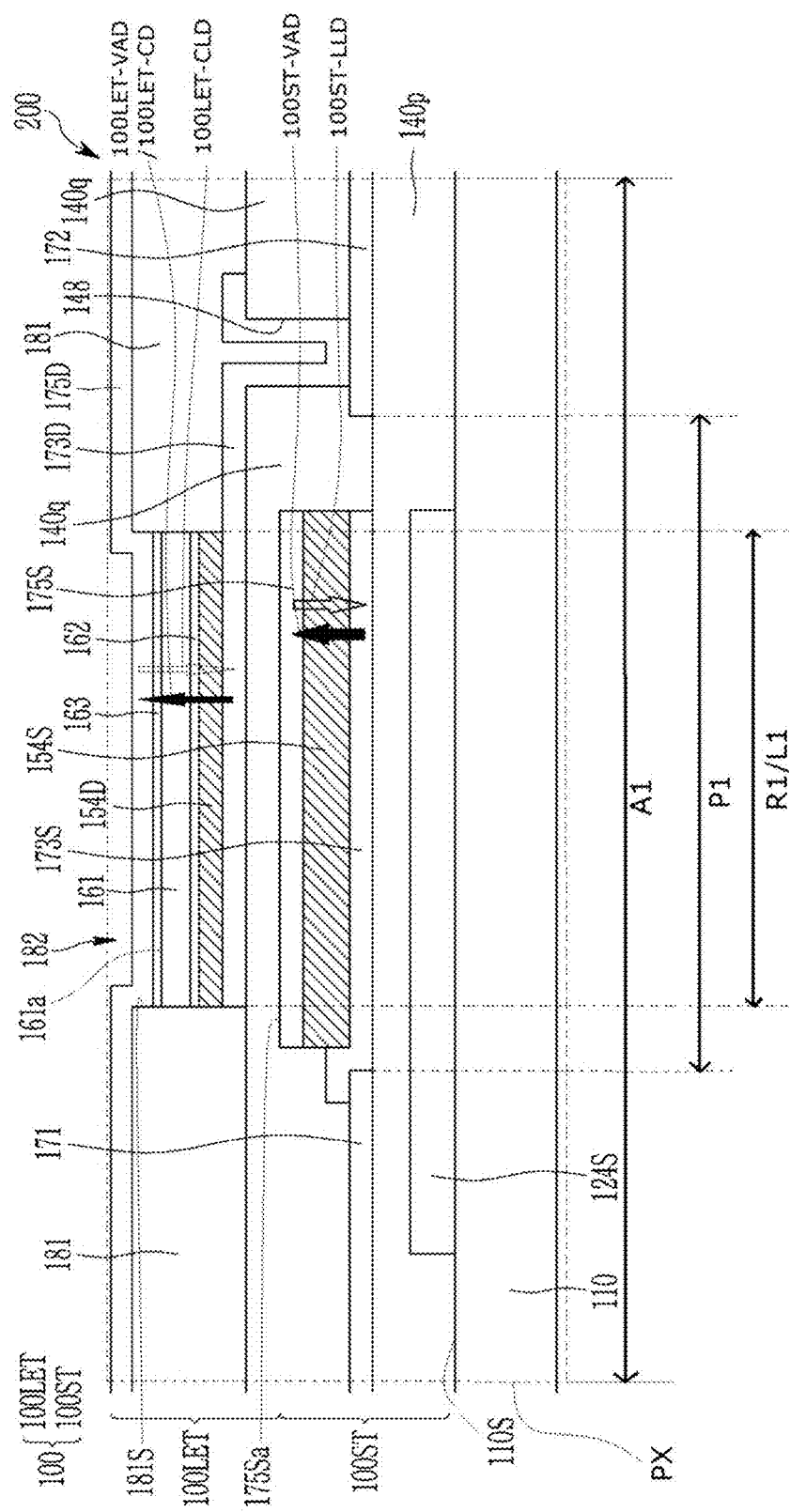
[FIG. 3]

[FIG. 4]
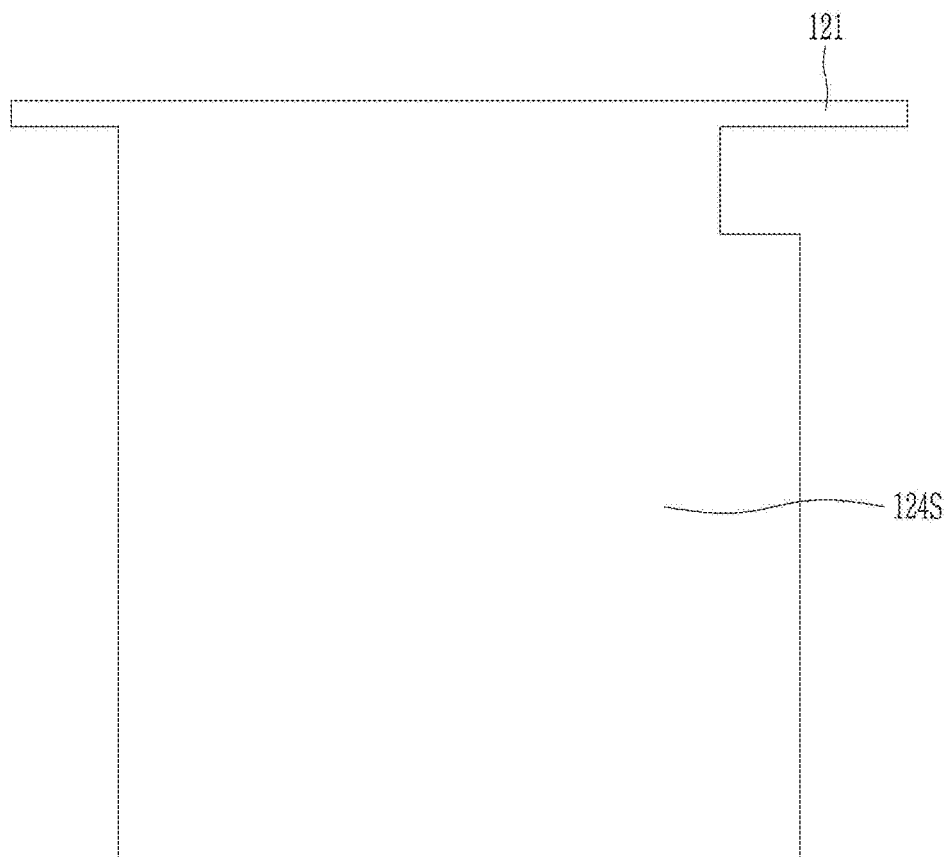
[FIG. 5]
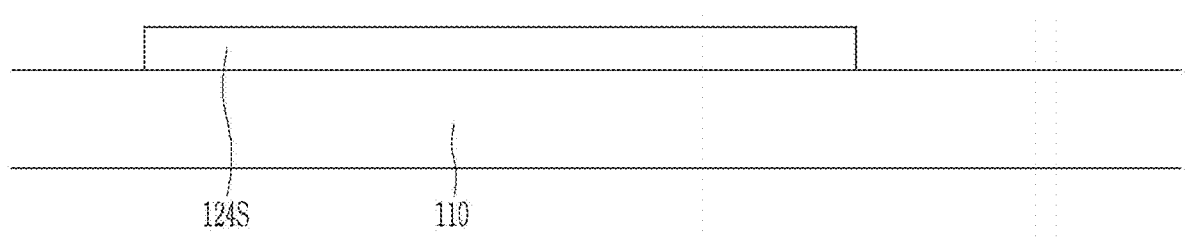

[FIG. 6]
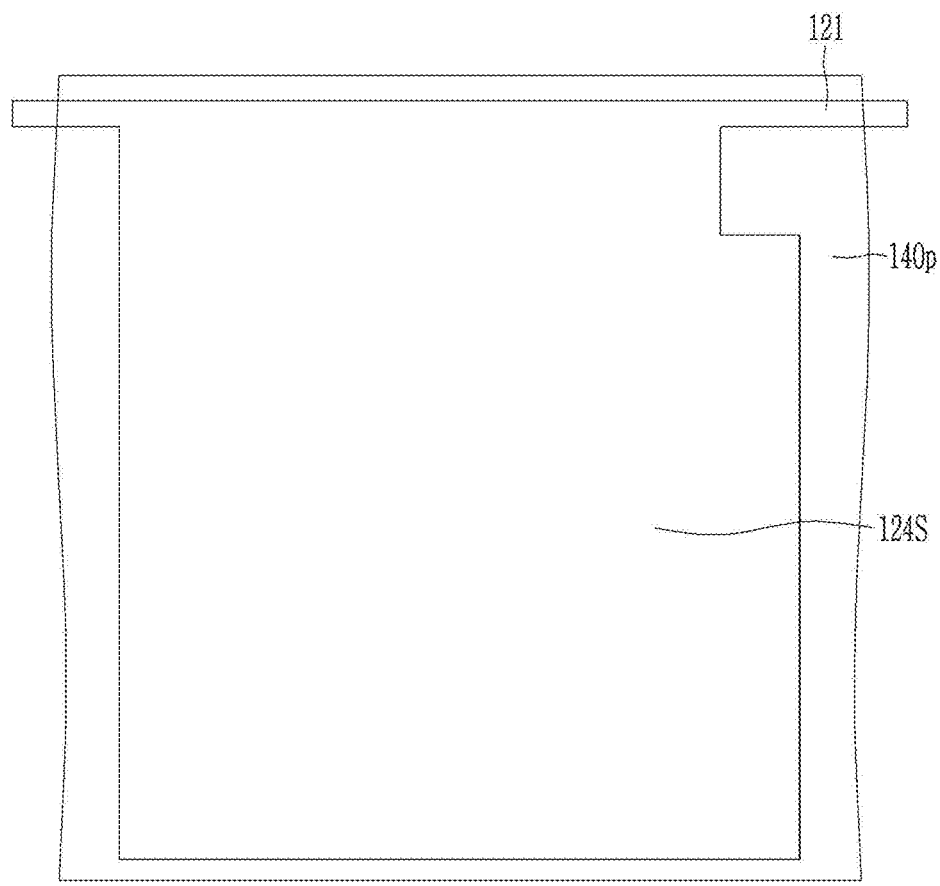
[FIG. 7]
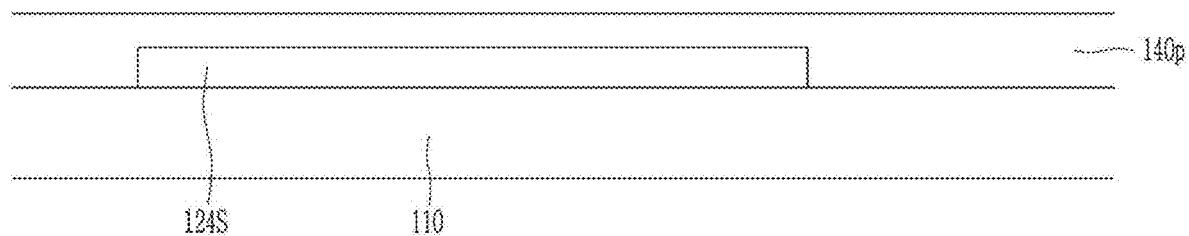

[FIG. 8]
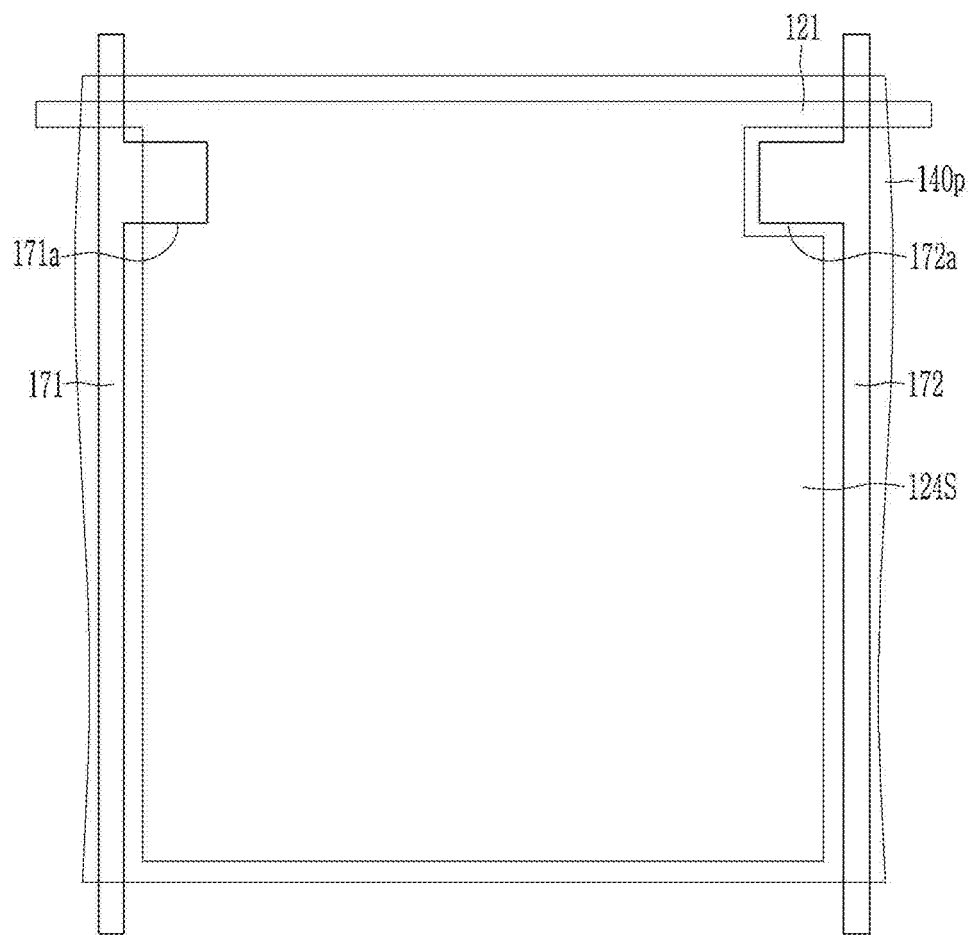
[FIG. 9]
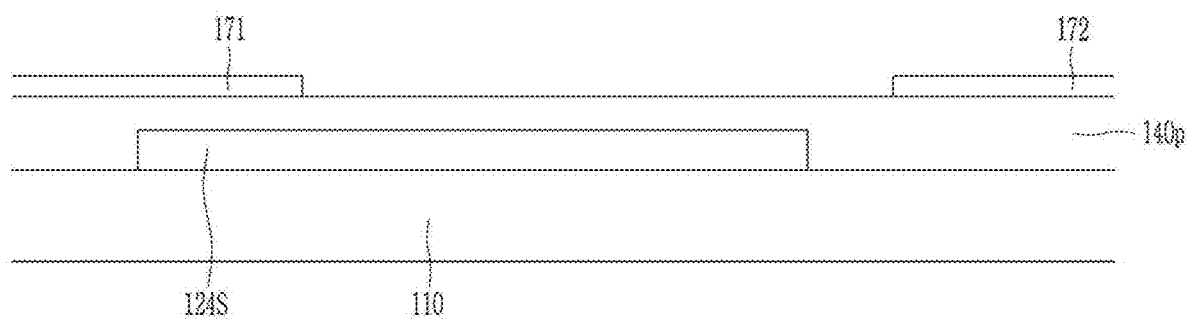

【FIG. 10】
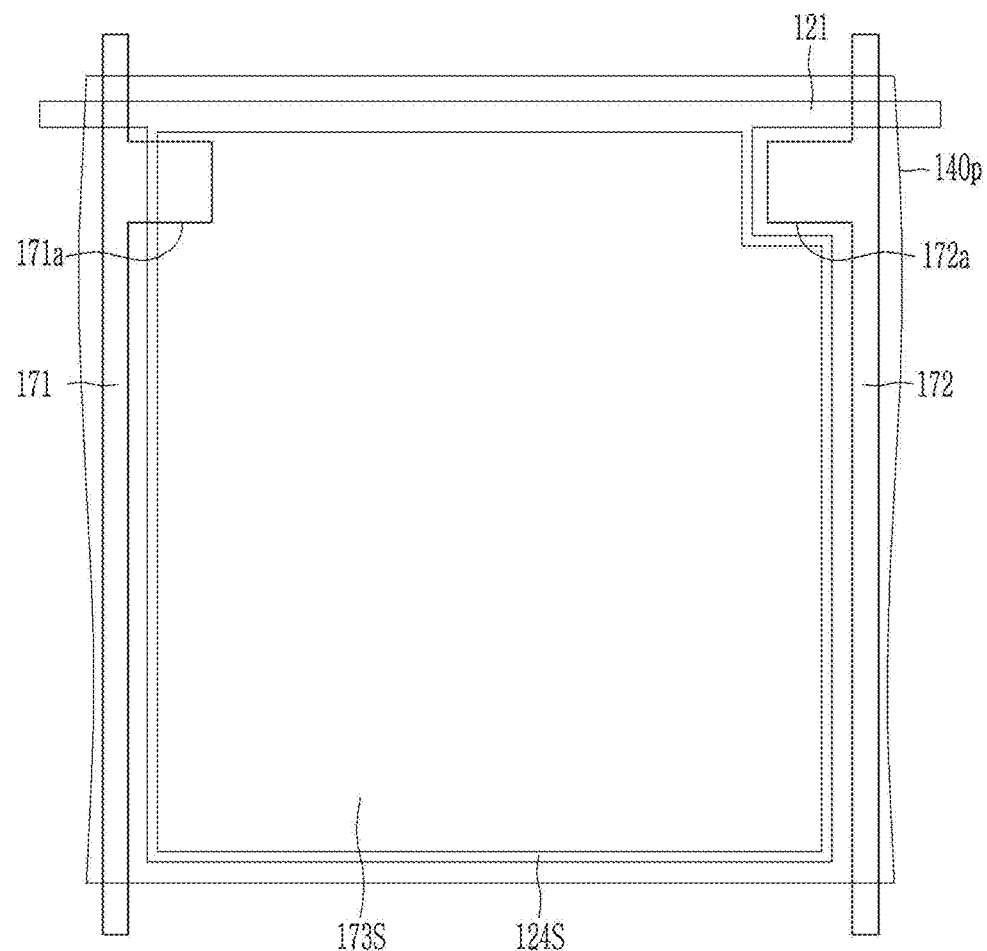
【FIG. 11】
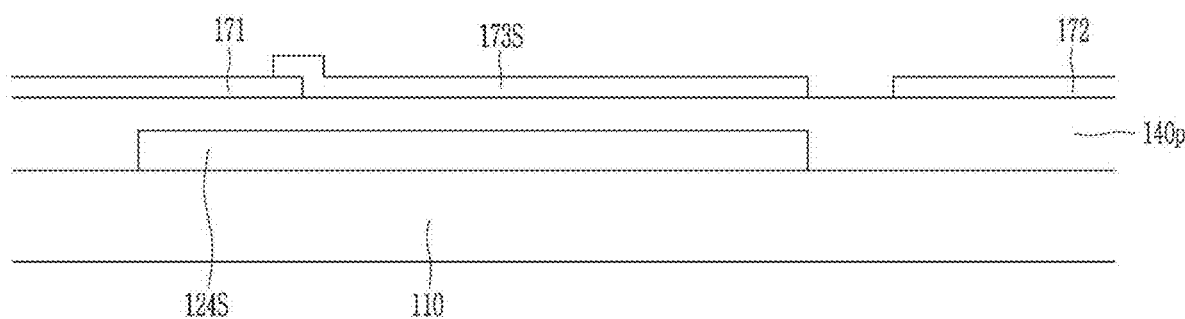

[FIG. 12]
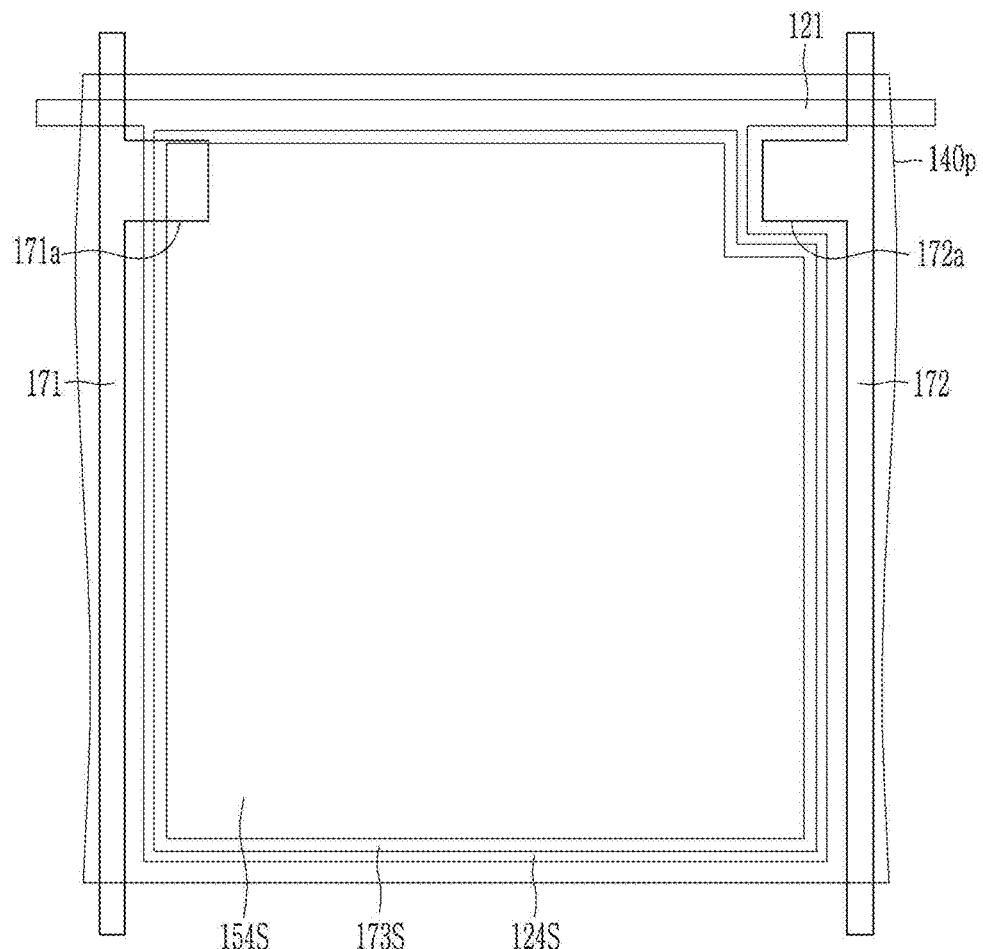
[FIG. 13]
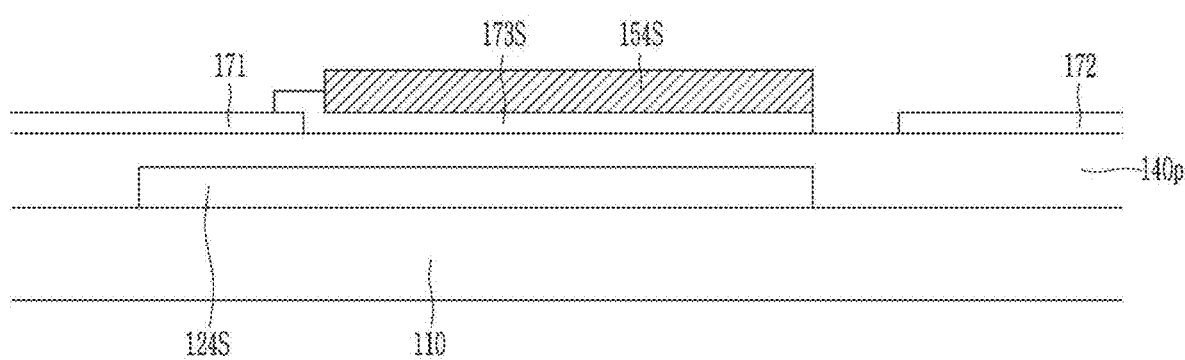

[FIG. 14]
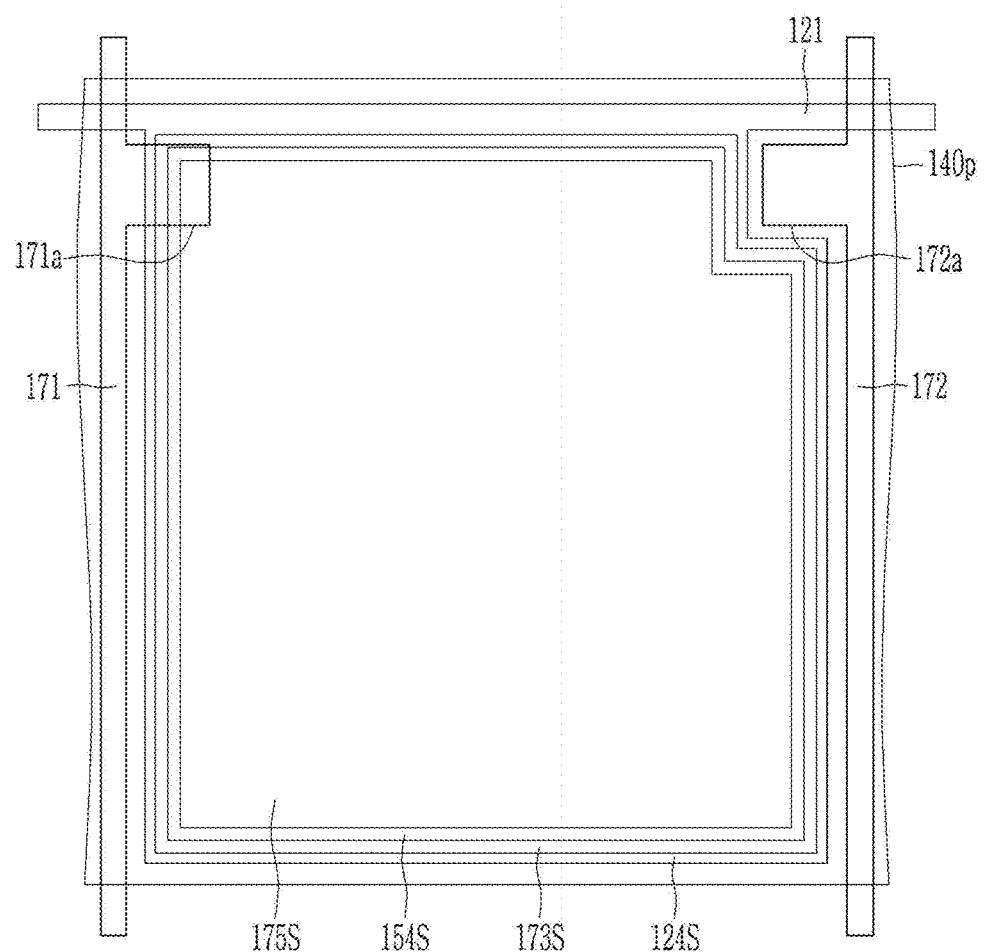
[FIG. 15]
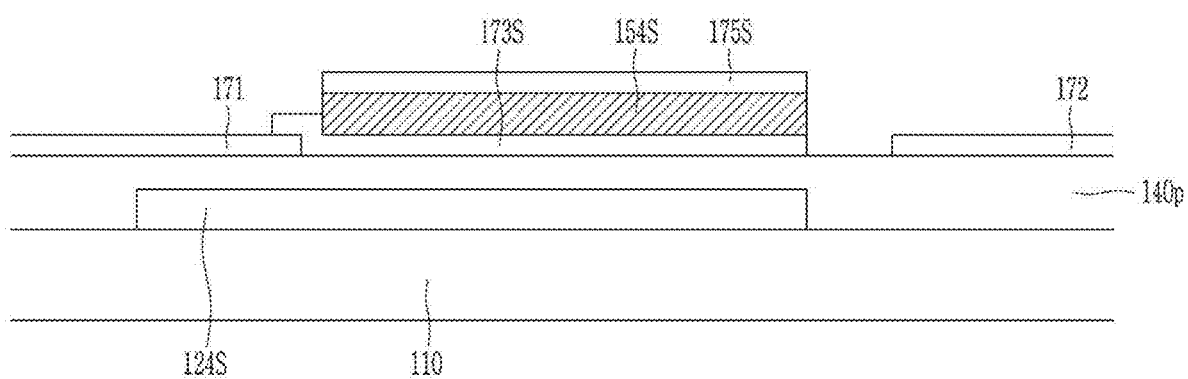

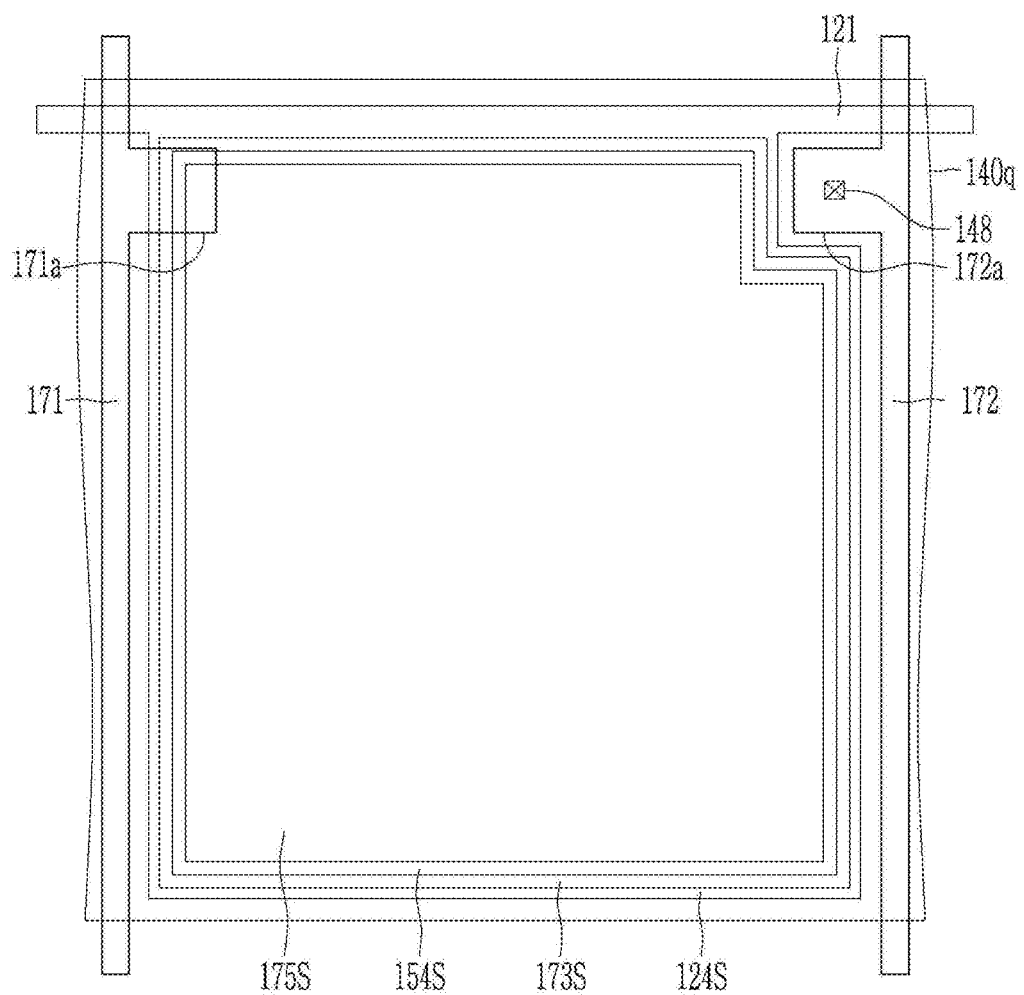
[FIG. 16]

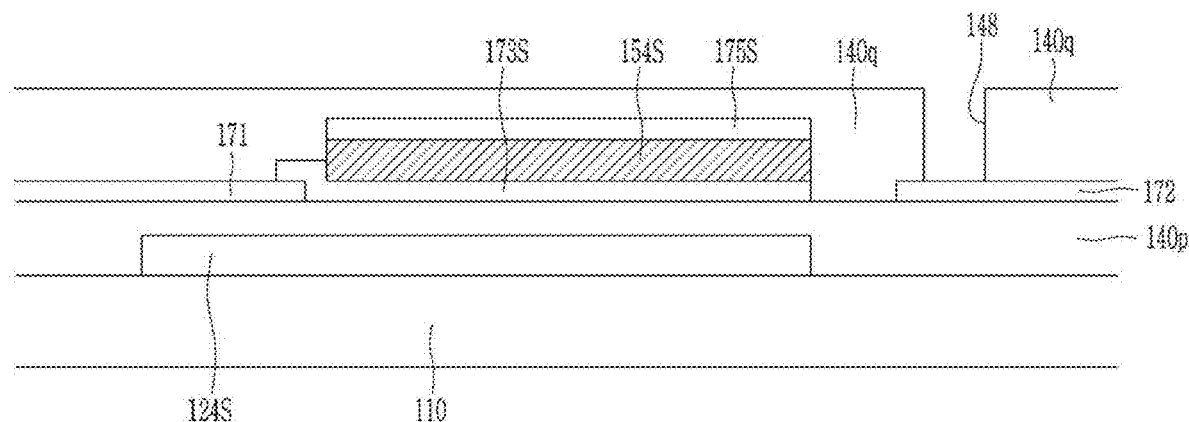
[FIG. 17]

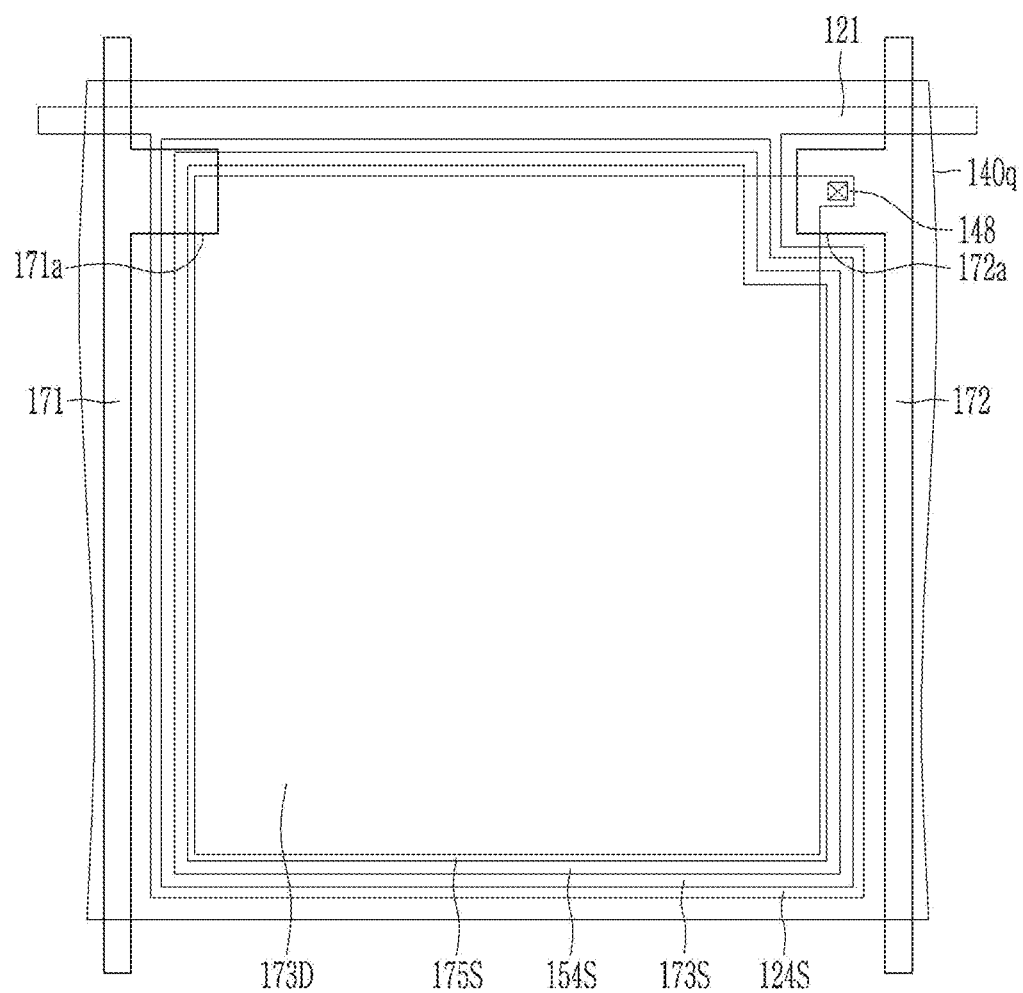

[FIG. 19]
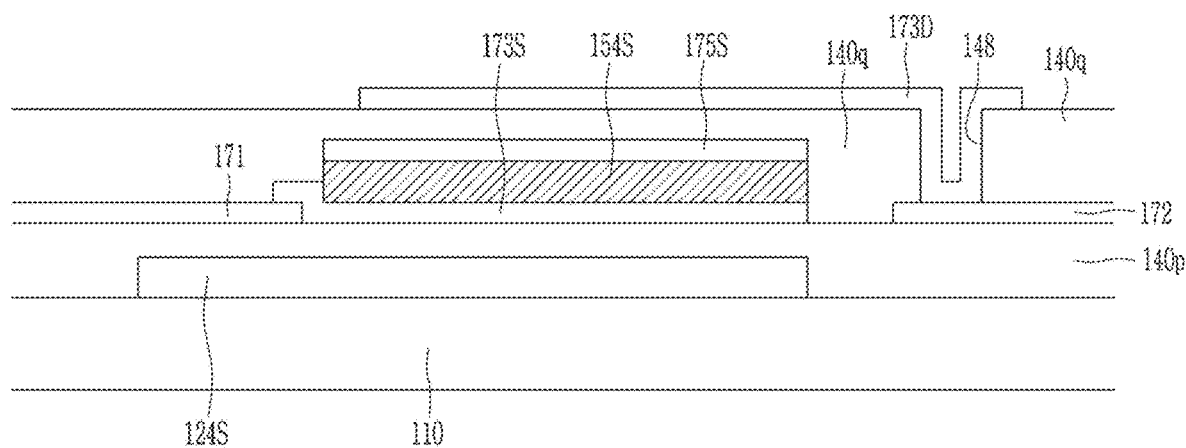

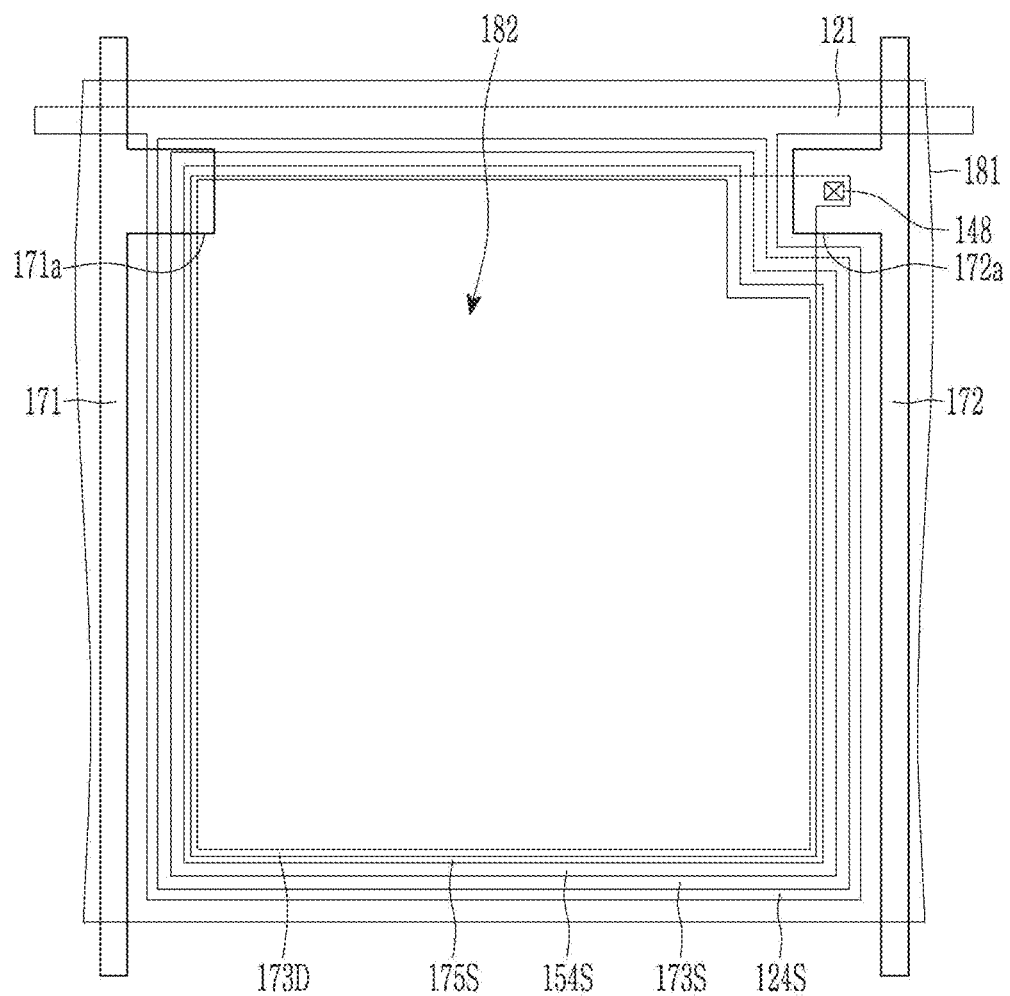

[FIG. 21]
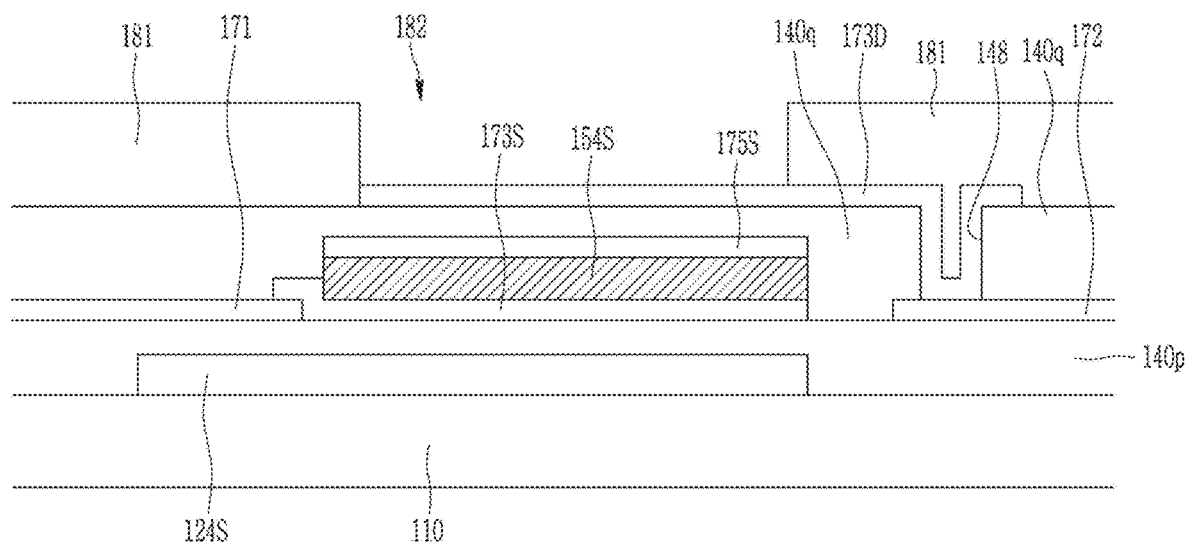

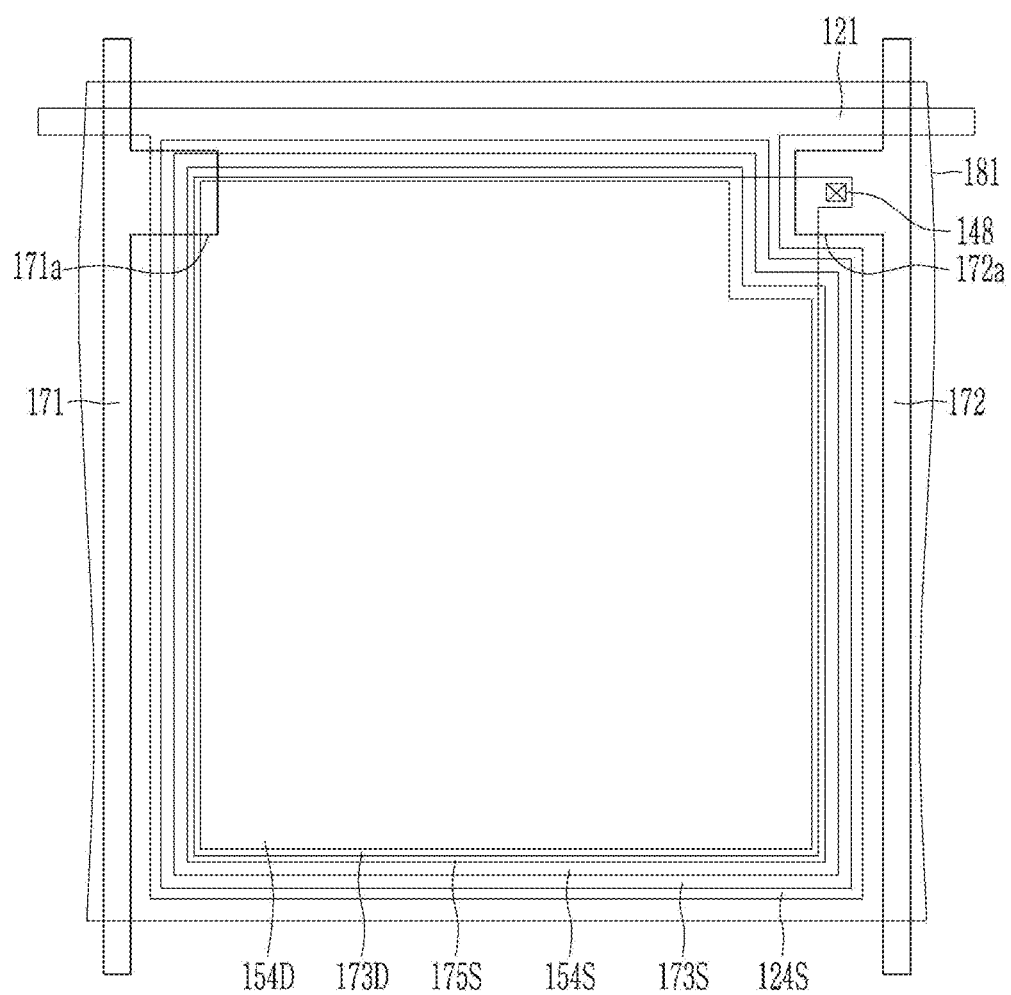
[FIG. 22]

[FIG. 23]
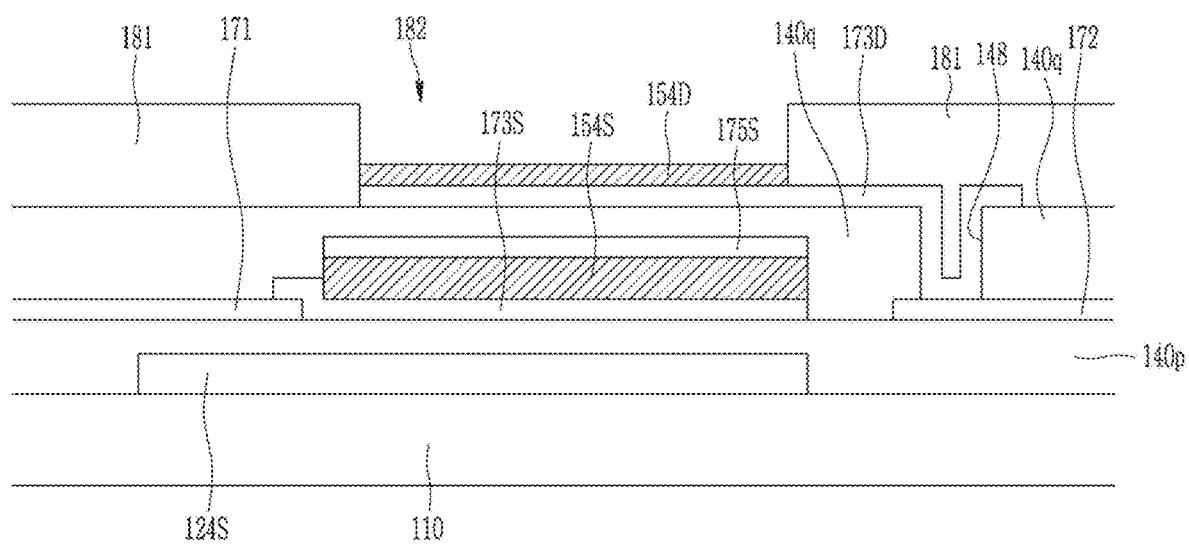

[FIG. 24]
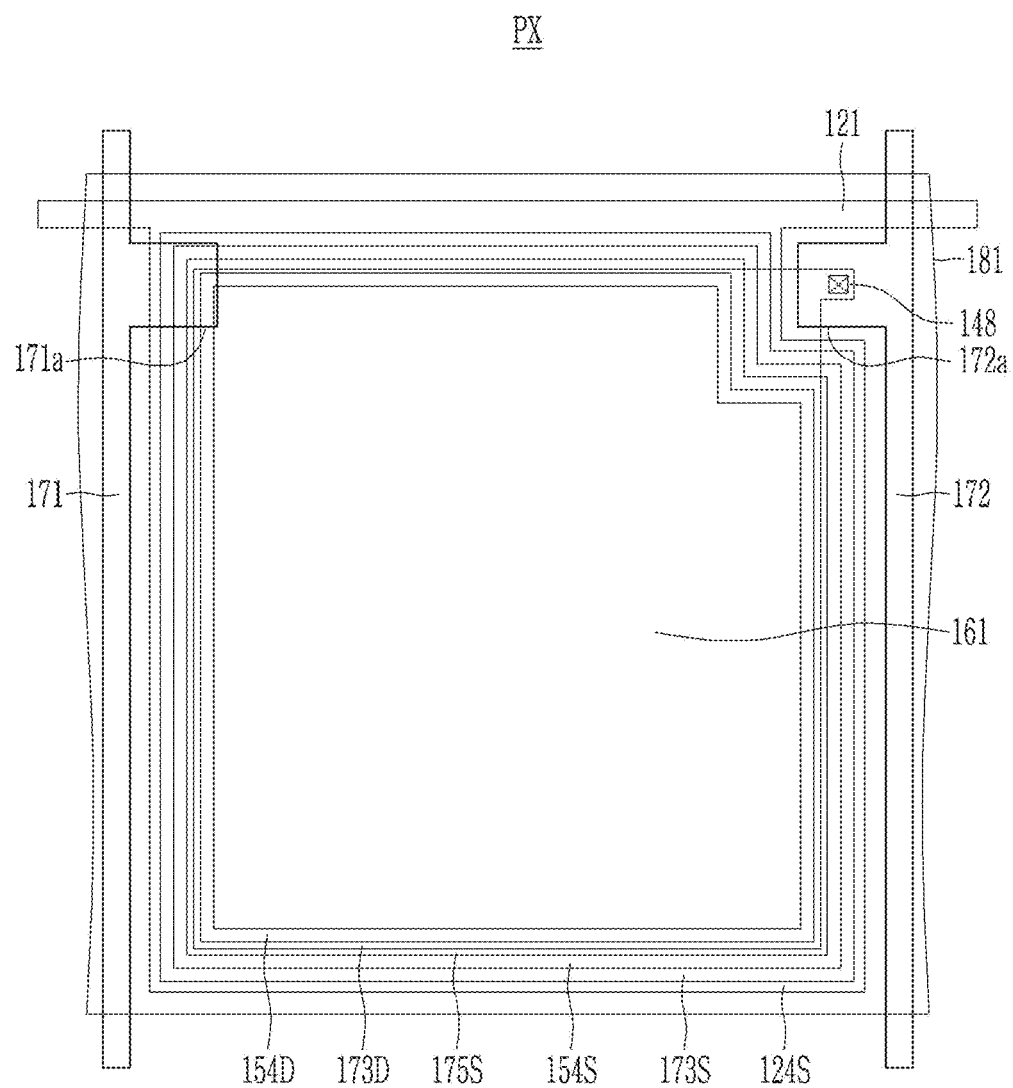

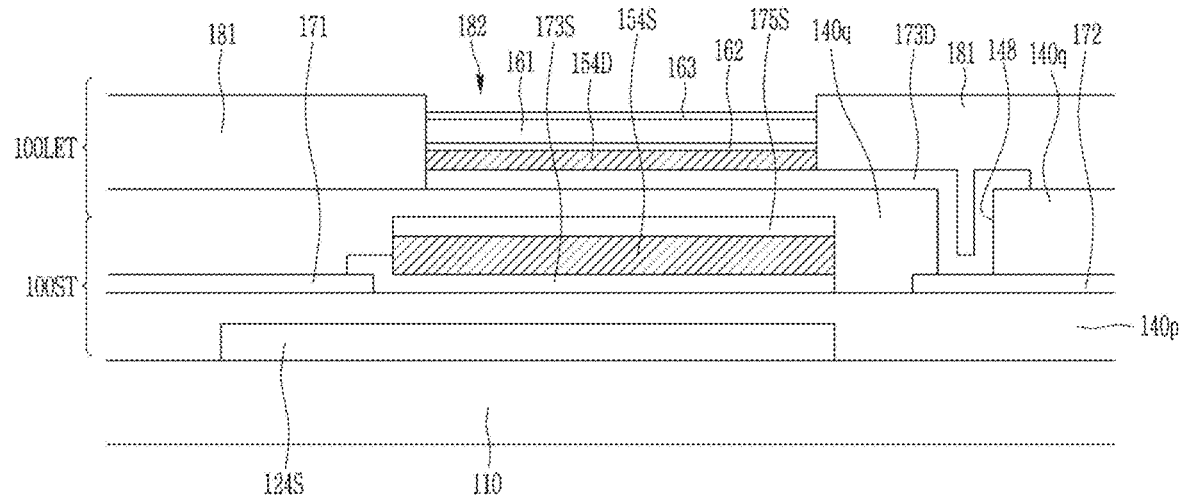
[FIG. 25]
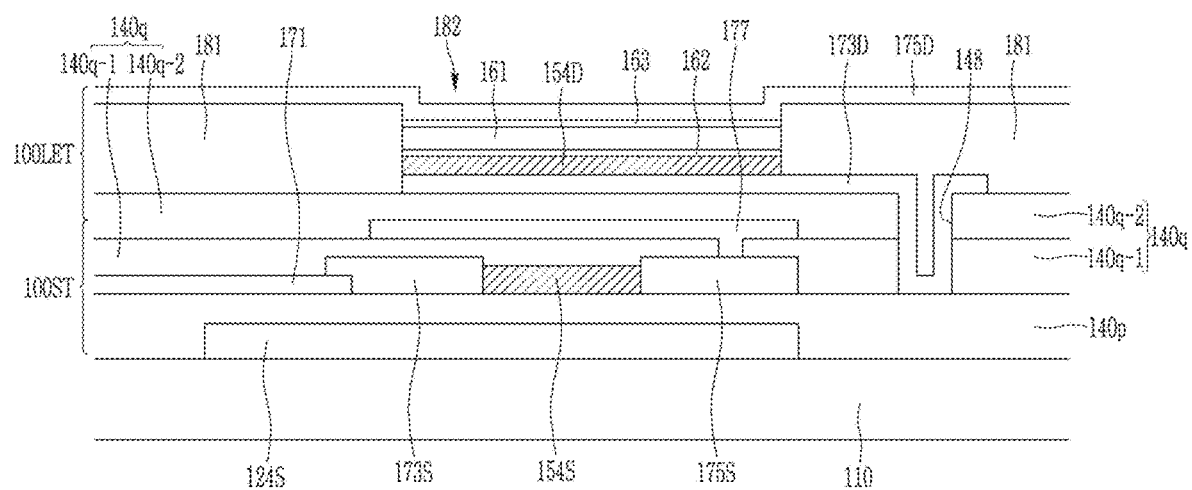
[FIG. 26]

[FIG. 27]
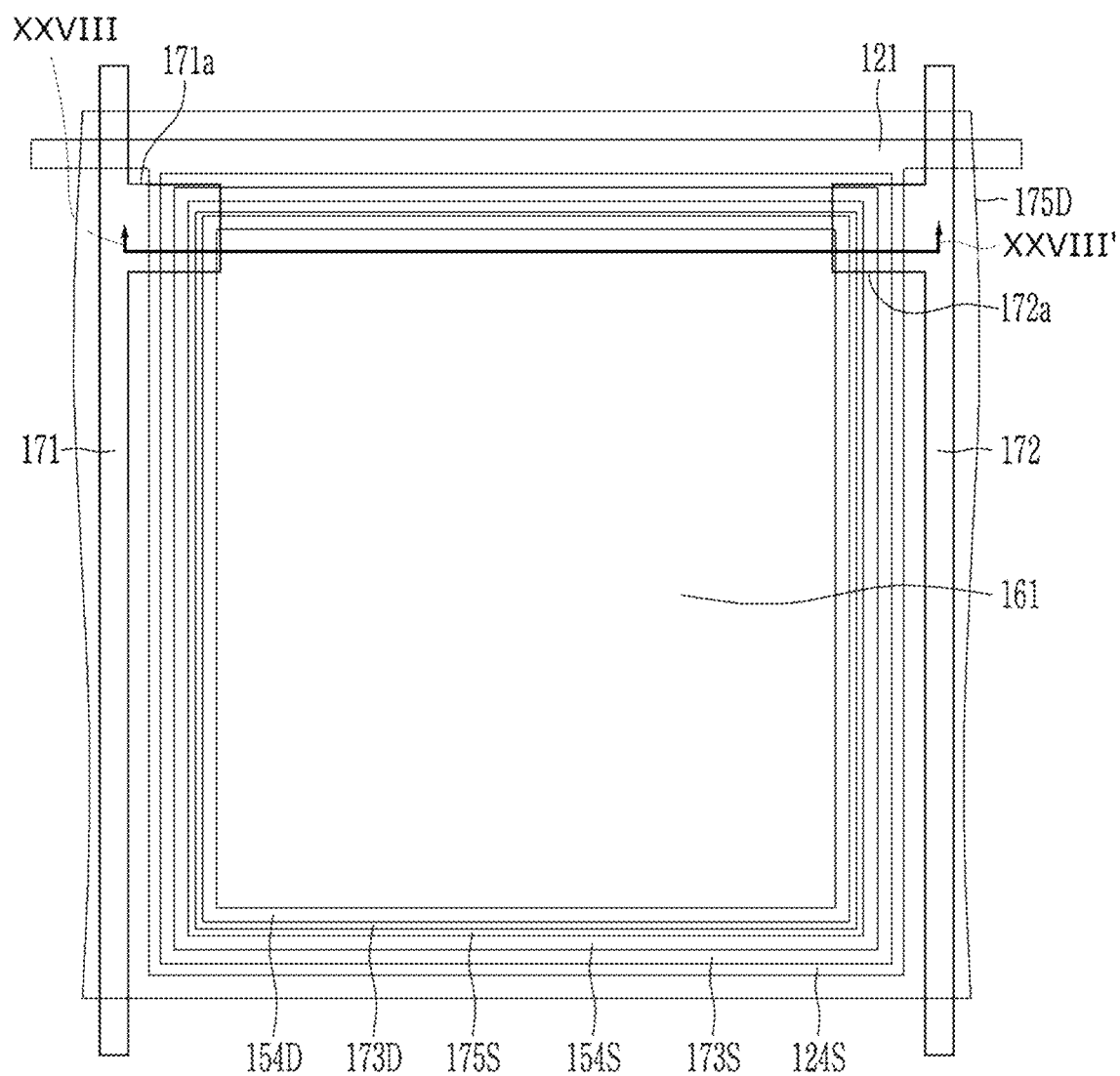

[FIG. 28]
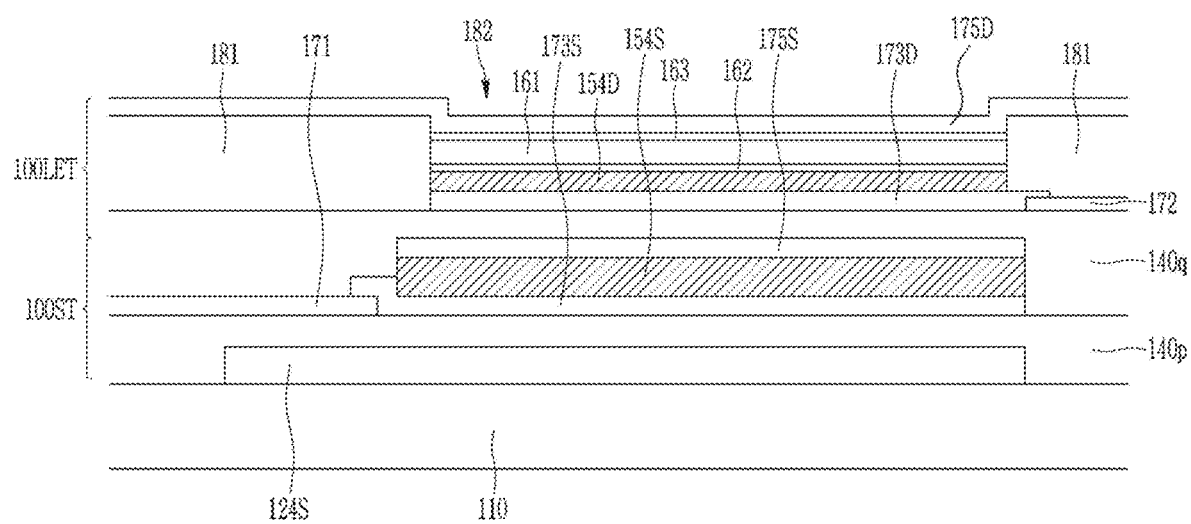

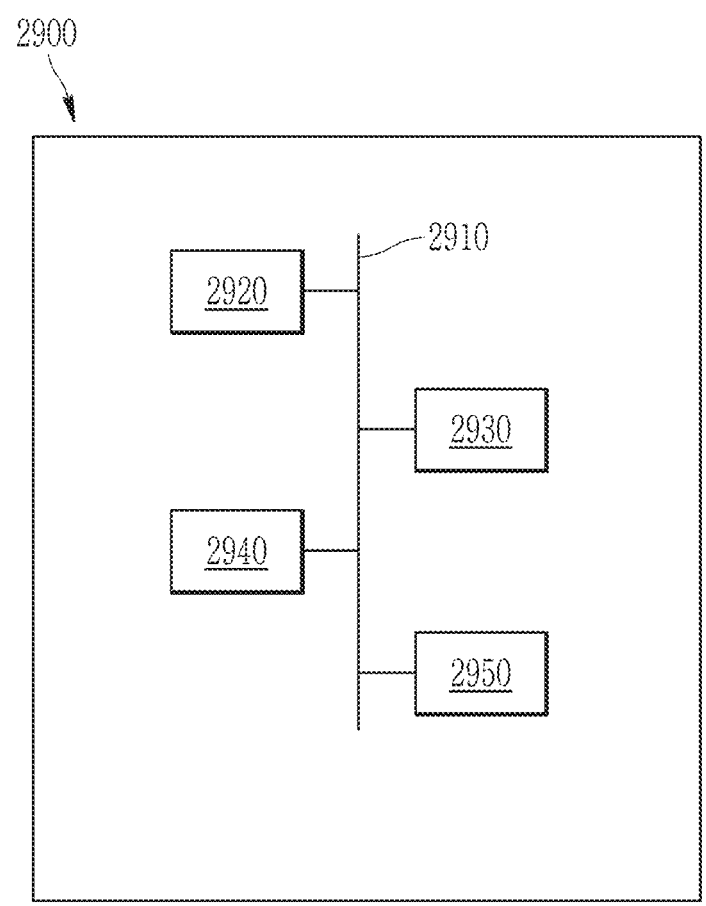
[FIG. 29A]

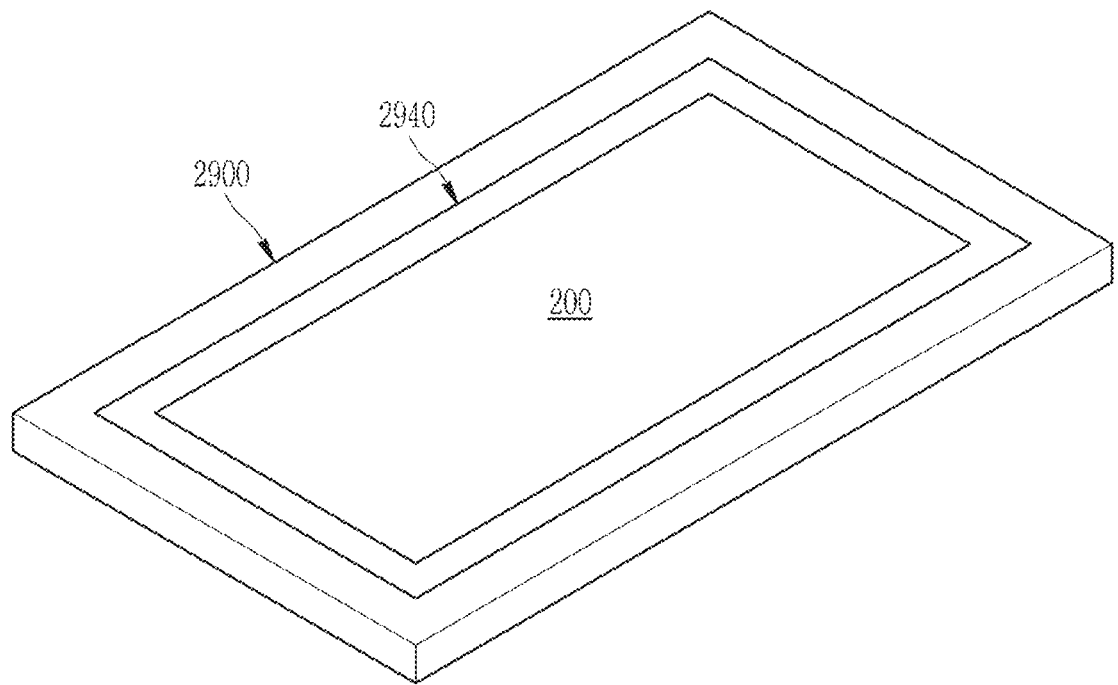
[FIG. 29B]

DISPLAY PANELS AND DISPLAY DEVICES

CROSS-REFERENCE TO RELATED APPLICATIONS

This application is a divisional of U.S. application Ser. No. 16/886,089, filed May 28, 2020, which claims priority to and the benefit of Korean Patent Application No. 10-2019-0154514 filed in the Korean Intellectual Property Office on Nov. 27, 2019, the entire contents of each of which are incorporated herein by reference.

BACKGROUND

1. Field

Display panels and display devices are disclosed.

2. Description of the Related Art

In a display panel, a plurality of subpixels are arranged in a matrix to display an image. In this case, a plurality of transistors for driving an active matrix are required for each subpixel. However, since the plurality of transistors are disposed on a substrate and occupy separate predetermined areas, the display area, that is, the aperture ratio, may be reduced.

SUMMARY

Some example embodiments provide a display panel capable of securing a high aperture ratio and displaying an improved display quality.

Some example embodiments provide a display device including the display panel.

According to some example embodiments, a display panel may include a substrate, a switching transistor on the substrate, and a light-emitting transistor. The switching transistor may include a first gate electrode, a first source electrode, a first active layer, and a first drain electrode. The light-emitting transistor may include a second gate electrode, a second source electrode, a second active layer, a light-emitting layer, and a second drain electrode. The second gate electrode may be the first drain electrode of the switching transistor. The switching transistor, the second source electrode, the second active layer, the light-emitting layer, and the second drain electrode may be stacked in a direction that is perpendicular to a surface of the substrate.

A channel length direction of the light-emitting transistor may be parallel to a gate voltage application direction of the light-emitting transistor.

The first source electrode, the first active layer, and the first drain electrode may be stacked vertically with respect to the first gate electrode.

A channel length direction of the switching transistor may be parallel to a gate voltage application direction of the switching transistor.

The first active layer may be overlapped with the second active layer in the direction perpendicular to the surface of the substrate.

The first gate electrode, the first source electrode, the first active layer, the first drain electrode, the second source electrode, the second active layer, the light-emitting layer, and the second drain electrode may be overlapped with each other in the direction perpendicular to the surface of the substrate.

The display panel may further include a first gate insulating layer between the first gate electrode and the first source electrode, and a second gate insulating layer between the first drain electrode and the second source electrode.

The display panel may further include a pixel definition layer on the second gate insulating layer, the pixel definition layer having an opening, and the second active layer and the light-emitting layer being in the opening.

A shape of the second active layer may be a same shape as a shape of the light-emitting layer.

A region in which the second source electrode, the light-emitting layer, and the second drain electrode are overlapped with each other in the direction perpendicular to the surface of the substrate may be defined as an emission region. The emission region may be overlapped with the switching transistor in the direction perpendicular to the surface of the substrate.

A current direction of the second source electrode, the light-emitting layer, and the second drain electrode may be parallel to a channel length direction of the switching transistor.

An area of the first drain electrode may be equal to or greater than an area of the light-emitting layer.

The light-emitting layer may include an organic light-emitting material, a quantum dot, a perovskite, or a combination thereof.

An aperture ratio of the display panel may be greater than or equal to about 70%.

According to some example embodiments, a display panel may include a plurality of subpixels. Each subpixel of the plurality of subpixels may include a switching transistor, and a light-emitting transistor stacked with the switching transistor. A channel length direction of the light-emitting transistor may be parallel to a gate voltage application direction of the light-emitting transistor.

The switching transistor may be a gate of the light-emitting transistor.

A channel length direction of the switching transistor may be parallel to a gate voltage application direction of the switching transistor.

The switching transistor and the light-emitting transistor may be on a substrate. The switching transistor may include a first gate electrode, a first source electrode, a first active layer, and a first drain electrode, and the light-emitting transistor may include a second gate electrode, a second source electrode, a second active layer, a light-emitting layer, and a second drain electrode, the second gate electrode being the first drain electrode of the switching transistor. The first active layer may be overlapped with the second active layer in a direction perpendicular to a surface of the substrate.

The first gate electrode, the first source electrode, the first active layer, the first drain electrode, the second source electrode, the second active layer, the light-emitting layer, and the second drain electrode may be overlapped with each other in the direction perpendicular to the surface of the substrate.

A current direction of the second source electrode, the light-emitting layer, and the second drain electrode may be parallel to a channel length direction of the switching transistor.

A ratio of an area of the light-emitting layer of a subpixel of the plurality of subpixels to an area of the subpixel is greater than or equal to about 70%.

A display device may include the display panel.

The display device may include an organic light-emitting diode (OLED) display, a quantum dot light-emitting diode, or a perovskite light-emitting diode.

A display device may include the display panel.

The display device may include an organic light-emitting diode (OLED) display, a quantum dot light-emitting diode, or a perovskite light-emitting diode.

According to some example embodiments, a display panel may include a switching transistor and a light-emitting transistor. The switching transistor may include a first gate electrode, a first source electrode, a first active layer, and a first drain electrode. The light-emitting transistor may include a second gate electrode, a second source electrode, a second active layer, a light-emitting layer, and a second drain electrode, the second gate electrode being the first drain electrode of the switching transistor. The switching transistor, the second source electrode, the second active layer, the light-emitting layer, and the second drain electrode may be stacked in a direction perpendicular to a surface of the light-emitting layer.

The display panel may include a substrate, wherein the switching transistor and the light-emitting transistor are on the substrate such that the switching transistor is between the light-emitting transistor and the substrate.

A channel length direction of the light-emitting transistor may be parallel to a gate voltage application direction of the light-emitting transistor.

The first source electrode, the first active layer, and the first drain electrode may be stacked vertically with respect to the first gate electrode.

A channel length direction of the switching transistor may be parallel to a gate voltage application direction of the switching transistor.

The first active layer may be overlapped with the second active layer in the direction perpendicular to the surface of the light-emitting layer.

The display panel may further include a first gate insulating layer between the first gate electrode and the first source electrode, and a second gate insulating layer between the first drain electrode and the second source electrode.

The display panel may further include a pixel definition layer on the second gate insulating layer, the pixel definition layer having an opening. The second active layer and the light-emitting layer may be in the opening.

A display device may include the display panel.

An electronic device may include the display device.

The display quality may be improved by securing a high aperture ratio.

BRIEF DESCRIPTION OF THE DRAWINGS

FIG. 1 is a schematic view illustrating an example of an arrangement of subpixels of a display panel according to some example embodiments, FIG. 2 is a layout view illustrating an example of one subpixel of the display panel of FIG. 1, FIG. 3 is a cross-sectional view of the subpixel of the display panel of FIG. 2 taken along cross-sectional view line III-III', FIGS. 4, 6, 8, 10, 12, 14, 16, 18, 20, 22, and 24 are layout views illustrating an example of a method of manufacturing the display panels of FIGS. 1 to 3, FIGS. 5, 7, 9, 11, 13, 15, 17, 19, 21, 23, and 25 are cross-sectional views illustrating an example of a method of manufacturing the display panels of FIGS. 1 to 3, FIG. 26 is a cross-sectional view illustrating another example of one subpixel of a display panel according to some example embodiments, FIG. 27 is a layout view illustrating another example of one subpixel of a display panel according to some example embodiments, FIG. 28 is a cross-sectional view of the subpixel of the display panel of FIG. 27 taken along cross-sectional view line XXVII-XXVII', FIG. 29A is a schematic diagram of an electronic device according to some example embodiments, and FIG. 29B is a perspective view of the electronic device of FIG. 29A according to some example embodiments.

DETAILED DESCRIPTION

Example embodiments will hereinafter be described in detail, and may be easily performed by a person having an ordinary skill in the related art. However, this disclosure may be embodied in many different forms and is not to be construed as limited to the example embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

Hereinafter, "combination" includes a mixture and two or more stacked structures.

Hereinafter, a display panel according to some example embodiments is described with reference to the drawings.

FIG. 1 is a schematic view illustrating an example of an arrangement of subpixels of a display panel according to some example embodiments.

Referring to FIG. 1, the display panel 200 may include a plurality of subpixels (PX), and the plurality of subpixels (PX) may have a matrix array repeatedly arranged along rows and/or columns. The display panel 200 may include a unit subpixel group (A) that is repeatedly arranged, and the plurality of subpixels (PX) in the unit subpixel group (A) include 3×1, 2×2, 3×3, or 4×4 arrangements, but is not limited thereto. The arrangement of the subpixels (PX) may be, for example, a Bayer matrix, a PenTile matrix, and/or a diamond matrix, but is not limited thereto. Each subpixel (PX) may display red (R), green (G), blue (B), or white (W), and for example, the unit pixel group (A) may have an arrangement such as RGB, RGBG, RGBW, but is not limited thereto. Although all of the subpixels (PX) have the same size in the drawing, the present disclosure is not limited thereto, and one or more subpixels (PX) in the unit pixel group (A) may be larger or smaller than other subpixels (PX). Although all of the subpixels (PX) have the same shape in the drawing, the present disclosure is not limited thereto, and one or more subpixels (PX) in the unit pixel group (A) may have a different shape from other subpixels (PX).

FIG. 2 is a layout view illustrating an example of one subpixel of the display panel of FIG. 1, and FIG. 3 is a cross-sectional view of the subpixel of the display panel of FIG. 2 taken along cross-sectional view line III-III'.

Referring to FIGS. 2 and 3, the display panel 200 according to some example embodiments includes a substrate 110, a plurality of signal lines 121, 171, and 172, a switching transistor 100ST, and a light-emitting transistor 100LET. As shown in FIGS. 1-3, the display panel 200 may include a plurality of subpixels (PX), where each subpixel (PX) includes a switching transistor 100ST and a light-emitting transistor 100LET stacked with (e.g., above or beneath) the switching transistor 100ST.

The substrate 110 may be, for example, a glass substrate; an inorganic substrate such as a silicon wafer; or an organic substrate made of an organic material such as polycarbonate, polymethylmethacrylate, polyethylene terephthalate, polyethylene naphthalate, polyimide, polyamide, polyamideimide, polyethersulfone, or a combination thereof. It will be understood that, in some example embodiments, the substrate 110 may be absent from the display panel 200, such that the display panel 200 may include the plurality of subpixels (PX) having a switching transistor 100ST and a light-emitting transistor 100LET stacked therewith, and without any substrate 110.

A plurality of signal lines 121, 171, and 172 include gate lines 121 for transmitting a gate signal (or a scan signal), data lines 171 for transmitting a data signal, and driving voltage lines 172 for transmitting a driving voltage. The gate lines 121 may extend in a row direction, and the neighboring gate lines 121 may be disposed in parallel to each other. It will be understood that extending in the row direction may include extending substantially in the row direction, which includes extending in a direction that is in the row direction within manufacturing tolerances and/or material tolerances. The data lines 171 and the driving voltage lines 172 may extend in the column direction, and the neighboring data lines 171 and the neighboring driving voltage lines 172 may be arranged in parallel to each other. It will be understood that extending in the column direction may include extending substantially in the column direction, which includes extending in a direction that is in the column direction within manufacturing tolerances and/or material tolerances. As shown in at least FIG. 2, each subpixel (PX) may be a region defined by the gate lines 121, the data lines 171, and the driving voltage lines 172, or may be disposed in the defined region.

The switching transistor 100ST may be electrically connected to the gate lines 121 and the data lines 171, and includes the first gate electrode 124S, the first source electrode 173S, the first active layer 154S, and the first drain electrode 175S. As shown in FIG. 3, the first source electrode 173S, the first active layer 154S, and the first drain electrode 175S may be stacked vertically with respect to the first gate electrode 124S.

The first gate electrode 124S may be electrically connected to the gate lines 121 and may be, for example, a pattern protruding from the gate lines 121. The first gate electrode 124S may be formed with a relatively large area, and may occupy most of the area of the subpixel (PX). Accordingly, the display panel 200 may not include a separate storage capacitor.

The first gate electrode 124S may be made of a low resistance conductor, for example a metal such as aluminum silver, gold, copper, magnesium, nickel, molybdenum or an alloy thereof; a conductive oxide such as indium tin oxide (ITO), indium zinc oxide (IZO), zinc tin oxide (ZTO), aluminum tin oxide (AITO), and aluminum zinc oxide (AZO); a conductive organic material; and/or a carbon conductor such as graphene and carbon nanostructures. For example, the first gate electrode 124S may be a transparent electrode or an opaque electrode. The transparent electrode may have a transmittance of greater than or equal to about 80% and may include a thin metal thin film or the aforementioned conductive oxide, conductive organic material, and/or carbon conductor. The opaque electrode may, for example, have a transmittance of less than about 10% or a reflectance of greater than or equal to about 5% and may include, for example, a metal.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The first source electrode 173S may be electrically connected to the data lines 171. For example, the first source electrode 173S may be in contact with the protruding portion 171a of the data lines 171. The first source electrode 173S may be formed with a relatively large area, and for example, may occupy most of the area of the subpixel (PX). For example, the first source electrode 173S may be overlapped with the first gate electrode 124S in a direction perpendicular to the surface 110S of the substrate 110.

The first source electrode 173S may be made of a low resistance conductor, for example, the aforementioned metal, conductive oxide, conductive organic material, and/or carbon conductor. The first source electrode 173S may be, for example, a transparent electrode or an opaque electrode.

For example, the first source electrode 173S may have a porous structure, a grid structure, a mesh structure, or a continuous linear structure. Accordingly, as illustrated in FIGS. 2 and 3, a gate voltage applied to the first gate electrode 124S may be effectively transferred to the first active layer 154S through the first source electrode 173S, in a structure in which the first source electrode 173S is disposed between the first gate electrode 124S and the first active layer 154S.

The first drain electrode 175S may face the first source electrode 173S, and for example, the first source electrode 173S and the first drain electrode 175S may face each other along a direction perpendicular to the surface 110S of the substrate 110. The first drain electrode 175S may be formed with a relatively large area, and may occupy most of the area of the subpixel (PX). For example, and as shown in FIGS. 2-3, an area of the first drain electrode 175S (e.g., surface area of surface 175Sa) may be equal to or larger (e.g., greater) than the area of the light-emitting layer 161 (e.g., surface area of surface 161a) which will be described later. The first drain electrode 175S may be made of a low resistance conductor, for example, the aforementioned metal, conductive oxide, conductive organic material, and/or carbon conductor. The first drain electrode 175S may be, for example, a transparent electrode or an opaque electrode.

The first active layer 154S may be disposed between the first source electrode 173S and the first drain electrode 175S, and may be electrically connected to the first source electrode 173S and the first drain electrode 175S, respectively. The first active layer 154S may be overlapped with the first gate electrode 124S in a direction perpendicular to the surface 110S of the substrate 110. The first active layer 154S may include, for example, an inorganic semiconductor such as amorphous silicon and/or crystalline silicon; an organic semiconductor such as a low molecular weight compound and/or a polymeric compound; or an oxide semiconductor, but is not limited thereto. For example, the first active layer 154S may include an organic semiconductor, and for example, may include a polycyclic condensed aromatic compound. For example, the first active layer 154S may include a deposited or soluble organic semiconductor.

For example, the first source electrode 173S, the first active layer 154S, and the first drain electrode 175S are stacked in a direction perpendicular to the first gate electrode 124S. Accordingly, the channel length direction of the switching transistor 100ST from the first source electrode 173S to the first drain electrode 175S may be perpendicular to the surface 110S of the substrate 110. Such a vertical channel (e.g., the channel length direction) may be parallel to a gate voltage application direction from the first gate electrode 124S to the first active layer 154S (e.g., a gate voltage application direction of the switching transistor 100ST). It will be understood that extending in parallel to a given direction may include extending substantially in parallel to the direction, which includes extending in a direction that is parallel to the given direction within manufacturing tolerances and/or material tolerances. Herein, since the channel length of the switching transistor 100ST may correspond to a thickness of the first active layer 154S, a short channel of less than or equal to about 5 μm, less than or equal to about 3 μm, less than or equal to about 2 μm, or less than or equal to about 1 μm may be implemented and thus current density of the switching transistor 100ST may be effectively increased.

A first gate insulating layer 140p may be formed between the first gate electrode 124S and the first source electrode 173S. The first gate insulating layer 140p may include an organic, inorganic, or organic/inorganic insulating material, and may include, for example, an inorganic insulating material such as silicon oxide, silicon nitride, and silicon oxynitride; an organic insulating material such as polyimide; or organic/inorganic insulating materials such as polyorganosiloxane and polyorganosilazane. In some example embodiments, the first gate insulating layer 140p is absent from the display panel 200.

The light-emitting transistor 100LET may be a gate-controlled light-emitting diode and may be a combination of a driving transistor and a light-emitting diode. In some example embodiments, including the example embodiments shown in FIGS. 2-3, the switching transistor 100ST may be a gate of the light-emitting transistor 100LET. For example, the first drain electrode 175S of the switching transistor 100ST may be a second gate electrode of the light-emitting transistor 100LET. Accordingly, when the switching transistor 100ST is operated, a gate voltage may be applied to the light-emitting transistor 100LET.

The second gate insulating layer 140q may be formed between the switching transistor 100ST and the light-emitting transistor 100LET. The second gate insulating layer 140q may include an organic, inorganic, or organic/inorganic insulating material, and may include, for example, an inorganic insulating material such as silicon oxide, silicon nitride, and silicon oxynitride; an organic insulating material such as polyimide; or organic/inorganic insulating materials such as polyorganosiloxane and polyorganosilazane. In some example embodiments, the second gate insulating layer 140q is absent from the display panel 200.

The light-emitting transistor 100LET is stacked with the switching transistor 100ST with the second gate insulating layer 140q therebetween, and the light-emitting transistor 100LET and the switching transistor 100ST are overlapped with each other in a direction perpendicular to the surface 110S of the substrate 110 within region R1.

As described above, the switching transistor 100ST may be used as a gate (a second gate electrode) of the light-emitting transistor 100LET. The light-emitting transistor 100LET includes the second source electrode 173D, the second active layer 154D, the light-emitting layer 161, the auxiliary layers 162 and 163, and a second drain electrode 175D.

The second source electrode 173D is electrically connected to the driving voltage line 172. For example, the second source electrode 173D may be electrically connected to the driving voltage line 172 through a contact hole 148 in a second gate insulating layer 140q. For example, the second source electrode 173D may be in contact with the protruding portion 172a of the driving voltage line 172. The second source electrode 173D may be formed with a relatively large area, for example, an area covering most of the area of the subpixel (PX) and the contact hole 148. For example, the second source electrode 173D may be overlapped with the switching transistor 100S in a direction perpendicular to the surface 110S of the substrate 110.

The second source electrode 173D may be made of a low resistance conductor, for example, the aforementioned metal, conductive oxide, conductive organic material, and/or carbon conductor. The second source electrode 173D may be, for example, a transparent electrode or an opaque electrode. For example, the second source electrode 173D may have a porous structure, a grid structure, a mesh structure, or a continuous linear structure. Accordingly, as shown in FIGS. 2 and 3, a gate voltage applied to the first drain electrode 175S of the switching transistor 100ST may be effectively transferred to the second active layer 154D, in a structure in which the second source electrode 173D is disposed between the switching transistor 100ST and the second active layer 154D.

The second drain electrode 175D may face the second source electrode 173D, and for example, the second source electrode 173D and the second drain electrode 175D may face each other in a direction perpendicular to the surface 110S of the substrate 110. The second drain electrode 175D may be a common electrode, and for example, may be formed on a whole surface of the display panel 200. The second drain electrode 175D may be made of a low resistance conductor, and may be made of, for example, the aforementioned metal, conductive oxide, conductive organic material, and/or carbon conductor. The second drain electrode 175D may be, for example, a transparent electrode or an opaque electrode.

The second active layer 154D may be disposed between the second source electrode 173D and the second drain electrode 175D, and may be electrically connected to the second source electrode 173D and the second drain electrode 175D, respectively. The second active layer 154D may be overlapped with the switching transistor 100ST in a direction perpendicular to the surface 110S of the substrate 110. The second active layer 154D and the first active layer 154S may be overlapped with each other in a direction perpendicular to the surface 110S of the substrate 110, and may have the same planar shape. It will be understood that elements having the same shape may include elements having substantially the same shape, which includes having the same shape within manufacturing tolerances and/or material tolerances. The second active layer 154D may include, for example, an inorganic semiconductor such as amorphous silicon and/or crystalline silicon; an organic semiconductor such as a low molecular weight compound and/or a polymeric compound; or an oxide semiconductor, but is not limited thereto. For example, the second active layer 154D may include an organic semiconductor, and for example, may include a polycyclic condensed aromatic compound. For example, the second active layer 154D may include a deposited or soluble organic semiconductor.

The light-emitting layer 161 may be disposed between the second source electrode 173D and the second drain electrode 175D, and electrically connected to the second source electrode 173D and the second drain electrode 175D, respectively. The light-emitting layer 161 may include a light-emitting organic material, a light-emitting inorganic material, a light-emitting organic/inorganic material, or a combination thereof. For example, the light-emitting layer 161 may include an organic light-emitting material, a quantum dot, a perovskite, or a combination thereof, but is not limited thereto.

The organic light-emitting material may include, for example, perylene or a derivative thereof, rubrene or a derivative thereof, 4-(dicyanomethylene)-2-methyl-6-[p-(dimethylamino)styryl]-4H-pyran or a derivative thereof, cumarin or a derivative thereof, carbazole or a derivative thereof, an organometallic compound including Pt, Os, Ti, Zr, Hf, Eu, Tb, Tm, Rh, Ru, Re, Be, Mg, Al, Ca, Mn, Co, Cu, Zn, Ga, Ge, Pd, Ag and/or Au, or a combination thereof, but is not limited thereto.

The quantum dot may include, for example, a Group II-VI semiconductor compound, a Group III-V semiconductor compound, a Group IV-VI semiconductor compound, a Group IV semiconductor element or compound, a Group semiconductor compound, a Group I-II-IV-VI semiconductor compound, a Group V semiconductor compound, or a combination thereof. The Group II-VI semiconductor compound may be for example a binary element of CdSe, CdTe, ZnS, ZnSe, ZnTe, ZnO, HgS, HgSe, HgTe, MgSe, MgS, or a combination thereof; a ternary element of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element of ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof, but is not limited thereto. The Group III-V semiconductor compound may be for example a binary element of GaN, GaP, GaAs, GaSb, AlN, AlP, AlAs, AlSb, InN, InP, InAs, InSb, or a combination thereof; a ternary element of GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof, but is not limited thereto. The Group IV-VI semiconductor compound may be for example a binary element of SnS, SnSe, SnTe, PbS, PbSe, PbTe, or a combination thereof; a ternary element of SnSeS, SnSeTe, SnSTe, PbSeS, PbSeTe, PbSTe, SnPbS, SnPbSe, SnPbTe, or a combination thereof; a quaternary element of SnPbSSe, SnPbSeTe, SnPbSTe, or a combination thereof; or a combination thereof, but is not limited thereto. The Group IV semiconductor element or compound may be for example a singular element semiconductor of Si, Ge, or a combination thereof; a binary element semiconductor of SiC, SiGe, or a combination thereof; or a combination thereof, but is not limited thereto. The Group semiconductor compound may be for example selected from CuInSe$_2$, CuInS$_2$, CuInGaSe, CuInGaS, or a combination thereof, but is not limited thereto. The Group I-II-IV-VI semiconductor compound may be for example CuZnSnSe, CuZnSnS, or a combination thereof, but is not limited thereto. The Group II-III-V semiconductor compound may include for example InZnP, but is not limited thereto.

The perovskite may include, for example, $CH_3NH_3PbBr_3$, $CH_3NH_3PbI_3$, $CH_3NH_3SnBr_3$, $CH_3NH_3SnI_3$, $CH_3NH_3Sn_{1-x}Pb_xBr_3$, $CH_3NH_3Sn_{1-x}Pb_xI_3$, $HC(NH_2)_2PbI_3$, $HC(NH_2)_2SnI_3$, $(C_4H_9NH_3)_2PbBr_4$, $(C_6H_5CH_2NH_3)_2PbBr_4$, $(C_6H_5CH_2NH_3)_2PbI_4$, $(C_6H_5C_2H_4NH_3)_2PbBr_4$, $(C_6H_{13}NH_3)_2(CH_3NH_3)_{n-1}Pb_nI_{3n+1}$, or a combination thereof, but is not limited thereto.

The auxiliary layers 162 and 163 may be disposed on the lower and upper surfaces of the light-emitting layer 161, respectively and may be a light-emitting auxiliary layer, a charge auxiliary layer, or a combination thereof. The auxiliary layers 162 and 163 may be, for example, at least one of a hole injection layer, a hole transport layer, an electron blocking layer, an electron injection layer, an electron transport layer, or a hole blocking layer. The auxiliary layers 162 and 163 may independently include an organic material, an inorganic material, or an organic/inorganic material. One or two of the auxiliary layers 162 and 163 may be omitted.

The auxiliary layers 162 and 163 may include, for example, poly(9,9-dioctyl-fluoren-2,7-diyl-co-(4,4'-(N-(4-butylphenyl)-diphenylamine)) (TFB), polyarylamine, poly (N-vinylcarbazole, polyaniline, polypyrrole, N,N,N',N'-tetrakis(4-methoxyphenyl)-benzidine (TPD), (4,4'-bis[N-(1-naphthyl)-N-phenyl-amino]biphenyl (α-NPD), m-MTD-ATA (4,4',4"-tris[phenyl(m-tolyl)amino]triphenylamine), 4,4',4"-tris(N-carbazolyl)-triphenylamine (TCTA), 1,1-bis [(di-4-tolylamino)phenyl]cyclohexane (TAPC), poly(3,4-ethylenedioxythiophene) (PEDOT) or poly(3,4-ethylenedioxythiophene) polystyrene sulfonate (PEDOT:PSS), p-type metal oxide (e.g., $NiO$, $WO_3$, $MoO_3$, etc.), a carbon-based material such as graphene oxide, or a combination thereof, but is not limited thereto.

The display panel 200 may further include a pixel definition layer 181. The pixel definition layer 181 may be on (e.g., directly or indirectly) on the second gate insulating layer 140q. The pixel definition layer 181 may be formed on a whole surface of the display panel 200, and may have an opening 182 (e.g., may include one or more inner surfaces 181S that define one or more openings 182) corresponding to each subpixel (PX) and defining an emission region, also referred to herein as an area R1 of the region where the second source electrode 173D, the light-emitting layer 161, and the second drain electrode 175D are overlapped in the vertical direction (e.g., the direction perpendicular to the surface 110S of the substrate 110 and/or the direction perpendicular to the surface 161a of the light-emitting layer 161). The opening 182 may be formed at a position overlapping at least a portion of the switching transistor 100ST. In some example embodiments, the pixel definition layer 181 is omitted from the display panel 200. The second active layer 154D, the light-emitting layer 161, and the auxiliary layers 162 and 163 may be disposed in the opening 182, and shapes and sizes of the second active layer 154D, the light-emitting layer 161, and the auxiliary layers 162 and 163 may be determined according to the opening 182. Accordingly, the shapes of the second active layer 154D, the light-emitting layer 161, and the auxiliary layers 162 and 163 may be the same, and the sizes of the second active layer 154D, the light-emitting layer 161, and the auxiliary layers 162 and 163 may be the same. It will be understood that elements having the same shape may include elements having substantially the same shape, which includes having the same shape within manufacturing tolerances and/or material tolerances. It will be understood that elements having the same size may include elements having substantially the same size, which includes having the same size within manufacturing tolerances and/or material tolerances.

The second source electrode 173D, the light-emitting layer 161, and the second drain electrode 175D may provide a light-emitting diode, wherein one of the second source electrode 173D or the second drain electrode 175D is an anode and the other of the second source electrode 173D and the second drain electrode 175D is a cathode. For example, the second source electrode 173D may be an anode and the second drain electrode 175D may be a cathode.

A region R1 where the second source electrode 173D, the light-emitting layer 161, and the second drain electrode 175D are overlapped in the vertical direction (e.g., the direction perpendicular to the surface 110S of the substrate 110 and/or the direction perpendicular to the surface 161a of the light-emitting layer 161) may be an emission region R1, and the emission region R1 may be overlapped with at least a portion of the switching transistor 100ST in the vertical direction. For example, the second source electrode 173D, the second active layer 154D, the light-emitting layer 161, the light-emitting auxiliary layers 162 and 163, and the second drain electrode 175D may be overlapped in a direction perpendicular to the switching transistor 100ST, for example, the first drain electrode 175S of the switching transistor 100ST. The switching transistor 100ST, the second source electrode 173D, the second active layer 154D, the light-emitting layer 161, and the second drain electrode 175D may be stacked in a direction perpendicular to the surface 110S of the substrate 110.

Accordingly, the channel length direction 100LET-CLD of the light-emitting transistor 100LET from the second source electrode 173D to the second drain electrode 175D may be perpendicular to the surface 110S of the substrate 110. Such a vertical channel may be parallel to the gate voltage application direction 100LET-VAD of the light-emitting transistor 100LET, from the first drain electrode 175S of the switching transistor 100ST to the second active layer 154D of the light-emitting transistor 100LET. Accordingly, the channel length direction 100LET-CLD of the light-emitting transistor 100LET may be parallel to the gate voltage application direction of the light-emitting transistor 100LET. Herein, since the channel length of the light-emitting transistor 100LET may correspond to the thickness of the second active layer 154D, a short channel length may be implemented to effectively increase current density of the light-emitting transistor 100LET.

For example, the current directions 100LET-CD of the light-emitting diodes of the second source electrode 173D, the light-emitting layer 161, and the second drain electrode 175D may be parallel to the gate voltage application direction 100ST-VAD applied from the switching transistor 100ST. The gate voltage application direction 100ST-VAD applied from the switching transistor 100ST is parallel to the channel length direction 100ST-CLD of the switching transistor 100ST. As a result, the current directions 100LET-CD of the light-emitting diodes of the second source electrode 173D, the light-emitting layer 161, and the second drain electrode 175D (e.g., the current direction 100LET-CD of the second source electrode 173D, the light-emitting layer 161, and the second drain electrode 175D) may be parallel to the channel length direction 100ST-CLD of the switching transistor 100ST.

As described above, since the light-emitting transistor 100LET is a gate-controlled light-emitting diode 100 including the switching transistor 100ST as a gate, the light-emitting diode 100 may be operated when the switching transistor 100ST is operated and a driving voltage is applied through the driving voltage line 172.

Specifically, when a gate voltage is applied to the first gate electrode 124S of the switching transistor 100ST and a data voltage is applied to the data line 171, a current flows from the first source electrode 173S to the first drain electrode 175S and a driving voltage is applied to the driving voltage line 172, a current flows between the second source electrode 173D and the second drain electrode 175D using the first drain electrode 175S as a gate to emit light from the light-emitting layer.

The display panel 200 may provide bottom emission to emit light toward the substrate 110, top emission to emit light toward the opposite side of the substrate 110, or dual emission to emit light both toward the substrate 110 and toward the opposite side of the substrate 110.

For example, when the first gate electrode 124S, the first source electrode 173S, and the first drain electrode 175S of the switching transistor 100ST are transparent electrodes and the second drain electrode 175D of the light-emitting transistor 100LET is an opaque electrode, the display panel 200 may implement bottom emission.

For example, when at least one of the first gate electrode 124S, the first source electrode 173S, or the first drain electrode 175S of the switching transistor 100ST is an opaque electrode and the second drain electrode 175D of the light-emitting transistor 100LET is a transparent electrode, the display panel 200 may implement top emission.

For example, when the first gate electrode 124S, the first source electrode 173S, and the first drain electrode 175S of the switching transistor 100ST and the second drain electrode 175D of the light-emitting transistor 100LET are transparent electrodes, respectively, the display panel 200 may implement dual emission.

As such, the display panel 200 according to some example embodiments may have a structure in which the switching transistor 100ST and the light-emitting transistor 100LET are stacked in a vertical direction. For example, the first gate electrode 124S, the first source electrode 173S, the first active layer 154S, the first drain electrode 175S, the second source electrode 173D, the second active layer 154D, and the light-emitting layer 161, and the second drain electrode 175D may be overlapped with each other in a direction perpendicular to the surface 110S of the substrate 110 within region R1, where region R1 is defined as the emission region. As further shown, region R1 may be a region in which the first gate electrode 124S, the first source electrode 173S, the first active layer 154S, the first drain electrode 175S, the second source electrode 173D, the second active layer 154D, and the light-emitting layer 161, and the second drain electrode 175D may be overlapped with each other in the direction perpendicular to the surface 110S of the substrate 110. It will be understood that the direction that is perpendicular to surface 110S is also the direction that is perpendicular to the surface 161a of the light-emitting layer.

Accordingly, an area occupied by the transistors in the subpixel (PX) may be reduced, thereby effectively increasing a display area, that is, an aperture ratio and an effective aperture ratio. Here, the aperture ratio is a ratio of an area that may transmit light with respect to an area of the display panel 200, and the effective aperture ratio is ratio of the area that may transmit light with respect to an area excluding the areas of the signal lines 121, 171, and 172 of the display panel 200. The area of the display panel 200 may be a sum of the areas of the plurality of subpixels (PX), and the area that may transmit light may be a sum of the areas of the light-emitting layers of each subpixel (PX). For example, the aperture ratio of the display panel 200 may be greater than or equal to about 70%, greater than or equal to about 72%, or greater than or equal to about 75%, and the effective aperture ratio of the display panel 200 may be greater than or equal to about 90%, greater than or equal to about 93%, greater than or equal to about 95%, or greater than or equal to about 97%.

With regard to a given subpixel (PX), for example as shown in FIGS. 2-3, the area of the subpixel (PX) that may transmit light may be the area R1 of the emission region. In addition, the area of the subpixel (PX) excluding the areas of the signal lines 121, 171, and 172 of the subpixel (PX) may be area P1, and the area of the subpixel (PX) may be area A1. The area of the light-emitting layer 161 may be L1, which may be the same as the area of the emission region R1.

The aperture ratio of the subpixel (PX) may be the ratio of area R1 to area A1, and the effective aperture ratio of the subpixel (PX) may be the ratio of area R1 to area P1. The aperture ratio of the subpixel (PX) (e.g., R1/A1) may be greater than or equal to about 70%, greater than or equal to about 72%, or greater than or equal to about 75%, and the effective aperture ratio of the subpixel (PX) (e.g., R1/P1) may be greater than or equal to about 90%, greater than or equal to about 93%, greater than or equal to about 95%, or greater than or equal to about 97%.

The aperture ratio of the subpixel (PX) may be the ratio of area L1 to area A1, and the effective aperture ratio of the subpixel (PX) may be the ratio of area L1 to area P1. The aperture ratio of the subpixel (PX) (e.g., L1/A1) may be greater than or equal to about 70%, greater than or equal to about 72%, or greater than or equal to about 75%, and the effective aperture ratio of the subpixel (PX) (e.g., L1/P1) may be greater than or equal to about 90%, greater than or equal to about 93%, greater than or equal to about 95%, or greater than or equal to about 97%.

By securing a high aperture ratio as described above, a reduction in luminance of the display panel 200 may be decreased and a high resolution may be realized, thereby improving display quality.

In addition, by reducing an area occupied by the transistor in the subpixel (PX), it is possible to realize bottom emission or dual emission, which is difficult to realize due to space limitation, thereby increasing a choice range of emission types.

In addition, by reducing an area occupied by the transistor in the subpixel (PX), constituent elements capable of performing additional functions while maintaining the same emission region may be additionally arranged in the display panel, as a form of an in-cell. The constituent elements that may be further disposed in the form of the in-cell may be, for example, a sensor such as a near infrared sensor, a visible light sensor, a fingerprint sensor, or a combination thereof, a driver or a circuit unit that performs additional functions, but is not limited thereto. Accordingly, a display panel having a complex or combination function may be realized without degrading display quality.

Hereinafter, an example of the manufacturing method of the display panel 200 described above is described with reference to FIGS. 4 to 25 and FIGS. 1 to 3.

FIGS. 4, 6, 8, 10, 12, 14, 16, 18, 20, 22, and 24 are layout views illustrating an example of a method of manufacturing the display panels of FIGS. 1 to 3. FIGS. 5, 7, 9, 11, 13, 15, 17, 19, 21, 23, and 25 are cross-sectional views illustrating an example of a method of manufacturing the display panels of FIGS. 1 to 3.

Referring to FIGS. 4 and 5, a conductive layer (not shown) is formed on the substrate 110 and is subjected to photolithography to form the gate line 121 and the first gate electrode 124S. The first gate electrode 124S may be a pattern protruding from the gate line 121, and may occupy most of the area of the subpixel (PX).

Referring to FIGS. 6 and 7, the first gate insulating layer 140p is formed a whole surface 110S of the substrate 110.

The first gate insulating layer 140p may be, for example, formed by depositing or coating an inorganic insulating material such as silicon oxide, silicon nitride, and silicon oxynitride; an organic insulating material such as polyimide; or organic/inorganic insulating materials such as polyorganosiloxane and polyorganosilazane.

Referring to FIGS. 8 and 9, a conductive layer (not shown) is formed on the first gate insulating layer 140p and is subjected to photolithography to form the data line 171 and the driving voltage line 172. The data line 171 and the driving voltage line 172 may extend in a direction perpendicular to the gate line 121. The data line 171 and the driving voltage line 172 may have protruding portions 171a and 172a, respectively. It will be understood that extending in a direction perpendicular to an element may include extending substantially in a direction perpendicular to an element, which includes extending in the direction perpendicular to the element within manufacturing tolerances and/or material tolerances.

Referring to FIGS. 10 and 11, the first source electrode 173S is formed on the first gate insulating layer 140p and the data line 171. The first source electrode 173S may be provided by forming a conductive layer (not shown) followed by photolithography, or may be formed by coating nanostructure dispersion. The first source electrode 173S may have, for example, a porous structure, a grid structure, a mesh structure, or a continuous linear structure. The first source electrode 173S may be formed to be overlapped with the first gate electrode 124S and may occupy most of the area of the subpixel (PX). A portion of the first source electrode 173S is in contact with the protruding portion 171a of the data line 171.

Referring to FIGS. 12 and 13, the first active layer 154S is formed on the first source electrode 173S. The first active layer 154S may be, for example, formed by depositing or coating an inorganic semiconductor such as amorphous silicon and/or crystalline silicon; an organic semiconductor such as a low molecular weight compound and/or a polymeric compound; or an oxide semiconductor. The first active layer 154S may be formed to be overlapped with the first source electrode 173S, and may be formed to have the same shape as the first source electrode 173S.

Referring to FIGS. 14 and 15, a conductive layer (not shown) is formed on the first active layer 154S and is subjected to photolithography to form the first drain electrode 175S. The first drain electrode 175S may be overlapped with the first source electrode 173S and the first active layer 154S, respectively, and may occupy most of the area of the subpixel (PX).

Referring to FIGS. 16 and 17, the second gate insulating layer 140q is formed on the first drain electrode 175S. The second gate insulating layer 140q may be, for example, formed by depositing or coating an organic, inorganic, or organic/inorganic insulating material, and may include, for example, an inorganic insulating material such as silicon oxide, silicon nitride, and silicon oxynitride; an organic insulating material such as polyimide; or organic/inorganic insulating materials such as polyorganosiloxane and polyorganosilazane. Subsequently, the second gate insulating layer 140q is subjected to photolithography to form a contact hole 148 that exposes the protruding portion 172a of the driving voltage line 172.

Referring to FIGS. 18 and 19, a second source electrode 173D is formed on the second gate insulating layer 140q. The second source electrode 173D may be provided by forming a conductive layer (not shown) followed by photolithography, or may be formed by coating nanostructure dispersion. The second source electrode 173D may have, for example, a porous structure, a grid structure, a mesh structure, or a continuous linear structure. The second source electrode 173D may be formed to be overlapped with the first drain electrode 175S and may occupy most of the area of the subpixel (PX). The second source electrode 173D may contact the driving voltage line 172 through the contact hole 148 of the second gate insulating layer 140$q$.

Referring to FIGS. 20 and 21, the insulating layer (not shown) is coated and patterned on the second gate insulating layer 140$q$ and the second source electrode 173D to form a pixel definition layer 181 having an opening 182. The opening 182 may be formed at a region corresponding to the subpixel (PX) or at a position corresponding to the emission region. The opening 182 may be formed in a region in which the first gate electrode 124S, the first source electrode 173S, the first active layer 154S, and the first drain electrode 175S are stacked.

Referring to FIGS. 22 and 23, a second active layer 154D is formed in the opening 182 of the pixel definition layer 181. The second active layer 154D may be, for example, formed by depositing or coating an inorganic semiconductor such as amorphous silicon and/or crystalline silicon; an organic semiconductor such as a low molecular weight compound and/or a polymeric compound; or an oxide semiconductor.

Referring to FIGS. 24 and 25, the light-emitting layer 161 and the auxiliary layers 162 and 163 are formed in the opening 182 of the pixel definition layer. The light-emitting layer 161 may be formed by depositing or coating a light-emitting material such as, for example, an organic light-emitting material, a quantum dot, a perovskite, or a combination thereof. The auxiliary layer 162 and 163 may be formed by depositing or coating a charge transport material. At least one of the auxiliary layers 162 or 163 may be omitted.

Referring to FIGS. 2 and FIG. 3, a conductive layer (not shown) is formed on the pixel definition layer 181, light-emitting layer 161, and auxiliary layers 162 and 163 and is subjected to photolithography to form the second drain electrode 175D. The second drain electrode 175D may be formed on a whole surface of the display panel 200.

Hereinafter, another example of the display panel 200 according to some example embodiments is described.

FIG. 26 is a cross-sectional view illustrating another example of one subpixel of a display panel according to some example embodiments.

The display panel 200 according to some example embodiments may include a substrate 110; a gate line 121; a data line 171; a driving voltage line 172; a switching transistor 100ST including a first gate electrode 124S, a first source electrode 173S, a first active layer 154S, and a first drain electrode 175S; a first gate insulating layer 140$p$; a second gate insulating layer 140$q$; a pixel definition layer 181; a light-emitting transistor 100LET including a second source electrode 173D, a second active layer 154D, a light-emitting layer 161, auxiliary layers 162 and 163, and a second drain electrode 175D, wherein the switching transistor 100ST and the light-emitting transistor 100LET are overlapped with each other in a direction perpendicular to the surface 110S of the substrate 110. The detailed description is as described above.

However, the display panel 200 according to some example embodiments includes a switching transistor 100ST having a co-planar structure, unlike the aforementioned example embodiments. That is, the first source electrode 173S and the first drain electrode 175S are arranged in parallel to the surface 110S of the substrate 110, and the first active layer 154S is disposed between the first source electrode 173S and the first drain electrode 175S. Accordingly, the channel length direction of the switching transistor 100ST from the first source electrode 173S to the first drain electrode 175S may be parallel to the surface 110S of the substrate 110, and may be perpendicular to the gate voltage application direction from the first gate electrode 124S to the first active layer 154S.

The display panel 200 may further include a capacitor electrode 177 electrically connected to the first drain electrode 175S, and the capacitor electrode 177 may be used as a gate of the light-emitting transistor 100LET. The second gate insulating layer 140$q$ includes a second lower gate insulating layer 140$q$-1 disposed between the switching transistor 100ST and the capacitor electrode 177, and a second upper gate insulating layer 140$q$-2 disposed between the capacitor electrode 177 and the light-emitting transistor 100LET.

Hereinafter, another example of the display panel 200 according to some example embodiments is described.

FIG. 27 is a layout view illustrating another example of one subpixel of a display panel according to some example embodiments, and FIG. 28 is a cross-sectional view of the subpixel of the display panel of FIG. 27 taken along cross-sectional view line XXVII-XXVII'.

Referring to FIGS. 27 and 28, the display panel 200 according to some example embodiments includes a substrate 110; a gate line 121; a data line 171; a driving voltage line 172; a switching transistor 100ST including a first gate electrode 124S, a first source electrode 173S, a first active layer 154S, and a first drain electrode 175S; a first gate insulating layer 140$p$; a second gate insulating layer 140$q$; a pixel definition layer 181; a light-emitting transistor 100LET including a second source electrode 173D, a second active layer 154D, a light-emitting layer 161, auxiliary layers 162 and 163, and a second drain electrode 175D, like the aforementioned example embodiments, wherein the switching transistor 100ST and the light-emitting transistor 100LET are overlapped with each other in a direction perpendicular to the surface 110S of the substrate 110. The detailed description is as described above.

However, in the display panel 200 according to some example embodiments, unlike the aforementioned example embodiments, the driving voltage line 172 and the second source electrode 173D directly contact each other without interposing the second gate insulating layer 140$q$ and thus the contact hole 148 of the second gate insulating layer 140$q$ may be omitted. Accordingly, the emission region may be further increased by an area of a connection portion between the driving voltage line 172 and the second source electrode 173D through the contact hole 148 described in the aforementioned example embodiments, thereby further increasing the aperture ratio.

For example, the aperture ratio of the display panel 200 may be greater than or equal to about 75%, greater than or equal to about 80%, or greater than or equal to about 85%, and the effective aperture ratio of the display panel 200 may be greater than or equal to about 93%, greater than or equal to about 95%, greater than or equal to about 97%, or greater than or equal to about 99%.

FIG. 29A is a schematic diagram of an electronic device 2900 according to some example embodiments. FIG. 29B is a perspective view of the electronic device 2900 of FIG. 29A according to some example embodiments.

An electronic device 2900 may include, but is not limited to a computing device, a tablet device, a mobile phone, a digital camera, an automobile part for incorporation into an automobile, any combination thereof, or the like. As shown in FIG. 29A, an electronic device 2900 may include a processor 2920, a memory 2930, a power supply 2950, and a display device 2940 that are electrically coupled together via a bus 2910. The display device 2940 may include a display panel of any of the example embodiments as described herein (e.g., display panel 200). In some example embodiments, the display device 2940 includes an organic light-emitting diode (OLED) display, a quantum dot light-emitting diode, or a perovskite light-emitting diode. For example the display panel 200 of the display device 2940 may include an OLED display panel, a quantum dot light-emitting diode display panel, or a perovskite light-emitting diode display panel. The memory 2930, which may be a non-transitory computer readable medium, may store a program of instructions. The processor 2920 may execute the stored program of instructions to perform one or more functions. For example, the processor 2920 may be configured to process electric signals generated by the display device 2940. The processor 2920 may be configured to generate an output (e.g., an image to be displayed by the display panel 200 of the display device 2940) based on processing the electric signals.

While this disclosure has been described in connection with what is presently considered to be practical example embodiments, it is to be understood that the inventive concepts are not limited to the disclosed example embodiments, but, on the contrary, is intended to cover various modifications and equivalent arrangements included within the spirit and scope of the appended claims.

What is claimed is:

1. A display panel, comprising:
    a plurality of subpixels,
    wherein each subpixel of the plurality of subpixels includes
        a switching transistor, and
        a light-emitting transistor stacked with the switching transistor,
    wherein a channel length direction of the light-emitting transistor is parallel to a gate voltage application direction of the light-emitting transistor,
    wherein a channel length direction of the switching transistor is parallel to a gate voltage application direction of the switching transistor, and
    wherein a drain electrode of the switching transistor is configured to be a gate electrode of the light-emitting transistor.

2. The display panel of claim 1, wherein the switching transistor is a gate of the light-emitting transistor.

3. The display panel of claim 1, wherein
    the switching transistor and the light-emitting transistor are on a substrate,
    the switching transistor includes a first gate electrode, a first source electrode, a first active layer, and a first drain electrode,
    the light-emitting transistor includes a second source electrode, a second active layer, a light-emitting layer, and a second drain electrode, wherein the first drain electrode of the switching transistor is configured to be the gate electrode of the light-emitting transistor, and
    the first active layer is overlapped with the second active layer in a direction perpendicular to a surface of the substrate.

4. The display panel of claim 3, wherein the first gate electrode, the first source electrode, the first active layer, the first drain electrode, the second source electrode, the second active layer, the light-emitting layer, and the second drain electrode are overlapped with each other in the direction perpendicular to the surface of the substrate.

5. The display panel of claim 3, wherein a current direction of the second source electrode, the light-emitting layer, and the second drain electrode is parallel to the channel length direction of the switching transistor.

6. The display panel of claim 3, wherein a ratio of an area of the light-emitting layer of a subpixel of the plurality of subpixels to an area of the subpixel is greater than or equal to about 70%.

7. The display panel of claim 1, wherein the display panel comprises an organic light-emitting diode (OLED) display panel, a quantum dot light-emitting diode display panel, or a perovskite light-emitting diode display panel.

8. An electronic device comprising:
    at least one processor; and
    the display panel of claim 1.

* * * * *